(12) United States Patent
Jarvis et al.

(10) Patent No.: US 10,881,015 B2
(45) Date of Patent: Dec. 29, 2020

(54) INTERNAL COMPONENT ARRANGEMENT WITHIN A HOUSING

(71) Applicant: Apple Inc., Cupertino, CA (US)

(72) Inventors: Daniel W. Jarvis, Sunnyvale, CA (US); Benjamin J. Pope, Sunnyvale, CA (US); Jason Sloey, San Jose, CA (US); Jonathan C. Denby, Los Altos Hills, CA (US); Ian A. Spraggs, San Francisco, CA (US); Shayan Malek, San Jose, CA (US)

(73) Assignee: Apple Inc., Cupertino, CA (US)

( * ) Notice: Subject to any disclaimer, the term of this patent is extended or adjusted under 35 U.S.C. 154(b) by 740 days.

(21) Appl. No.: 15/273,574

(22) Filed: Sep. 22, 2016

(65) Prior Publication Data

US 2017/0013738 A1 Jan. 12, 2017

Related U.S. Application Data

(63) Continuation of application No. 14/456,955, filed on Aug. 11, 2014, now Pat. No. 9,472,917, which is a
(Continued)

(51) Int. Cl.
*H05K 7/14* (2006.01)
*H04M 1/02* (2006.01)
(Continued)

(52) U.S. Cl.
CPC ............... *H05K 7/14* (2013.01); *H01H 23/04* (2013.01); *H01H 23/148* (2013.01);
(Continued)

(58) Field of Classification Search
CPC ..... H01H 23/04; H01H 23/148; H04M 1/026; H04M 11/0277; H04M 1/0277;
(Continued)

(56) References Cited

U.S. PATENT DOCUMENTS 3,471,822 A 10/1969 Baelen
6,084,192 A * 7/2000 Honma ............... H01H 15/10
200/332.1
(Continued)

FOREIGN PATENT DOCUMENTS

JP 2007150467 A 6/2007
JP 2012138734 A 7/2012
(Continued)

OTHER PUBLICATIONS

International Search Report and Written Opinion dated May 11, 2015 for PCT Application No. PCT/US2014/05070.

*Primary Examiner* — Xanthia C Cunningham
*Assistant Examiner* — Ingrid D Wright
(74) *Attorney, Agent, or Firm* — Dickinson Wright RLLP

(57) ABSTRACT

This application relates to securing and positioning internal components within a housing of a portable computing device. In one embodiment, a number of insert molded retaining members are utilized to inhibit outward deformation of a sidewall of the housing during a drop event. In another embodiment, a cowling is utilized to retain a number of board-to-board connectors within communication slots on a printed circuit board (PCB). In another embodiment, a C-shaped washer having diametrically opposed protrusions is utilized to adjust an alignment of an internal component.

17 Claims, 26 Drawing Sheets

Related U.S. Application Data continuation of application No. PCT/US2014/050570, filed on Aug. 11, 2014.

(51) Int. Cl.
*H01R 43/20* (2006.01)
*H05K 7/02* (2006.01)
*H05K 7/06* (2006.01)
*H01H 23/04* (2006.01)
*H01H 23/14* (2006.01)

(52) U.S. Cl.
CPC .......... *H01R 43/205* (2013.01); *H04M 1/026* (2013.01); *H04M 1/0277* (2013.01); *H05K 7/026* (2013.01); *H05K 7/06* (2013.01); *H04M 1/0274* (2013.01)

(58) Field of Classification Search
CPC ....... H04M 1/0274; H05K 7/026; H05K 7/06; H05K 7/14; H01R 43/205
See application file for complete search history.

(56) References Cited

U.S. PATENT DOCUMENTS

| | | | |
|---|---|---|---|
| 7,208,692 B2 * | 4/2007 | Yamaguchi | H01H 15/06 200/329 |
| 7,628,651 B2 | 12/2009 | Yeh | |
| 7,800,008 B2 * | 9/2010 | Shi | H01H 15/10 200/536 |
| 7,902,474 B2 | 3/2011 | Mittleman et al. | |
| 8,099,833 B2 | 1/2012 | Duan et al. | |
| 8,302,769 B2 | 11/2012 | Justiss | |
| 8,367,958 B2 | 2/2013 | Mittleman et al. | |
| 9,232,672 B2 | 1/2016 | Kwong et al. | |
| 2005/0201047 A1 | 9/2005 | Krah | |
| 2008/0264767 A1 | 10/2008 | Chen et al. | |
| 2012/0162940 A1 * | 6/2012 | Qiu | H01H 15/10 361/752 |
| 2012/0241295 A1 * | 9/2012 | Huang | H01H 3/50 200/330 |
| 2014/0140018 A1 | 5/2014 | Malek et al. | |
| 2014/0162736 A1 * | 6/2014 | Shin | H04B 1/3888 455/575.8 |
| 2014/0177180 A1 | 6/2014 | Malek et al. | |
| 2014/0192459 A1 | 7/2014 | Kwong et al. | |
| 2014/0360892 A1 | 12/2014 | Lin | |
| 2016/0044800 A1 | 2/2016 | Jarvis et al. | |
| 2016/0044816 A1 | 2/2016 | Jarvis et al. | |

FOREIGN PATENT DOCUMENTS

| | | | |
|---|---|---|---|
| JP | 2014045292 A | | 3/2014 |
| JP | 2015099661 A | * | 5/2015 |
| KR | 20120075088 A | | 7/2012 |

* cited by examiner

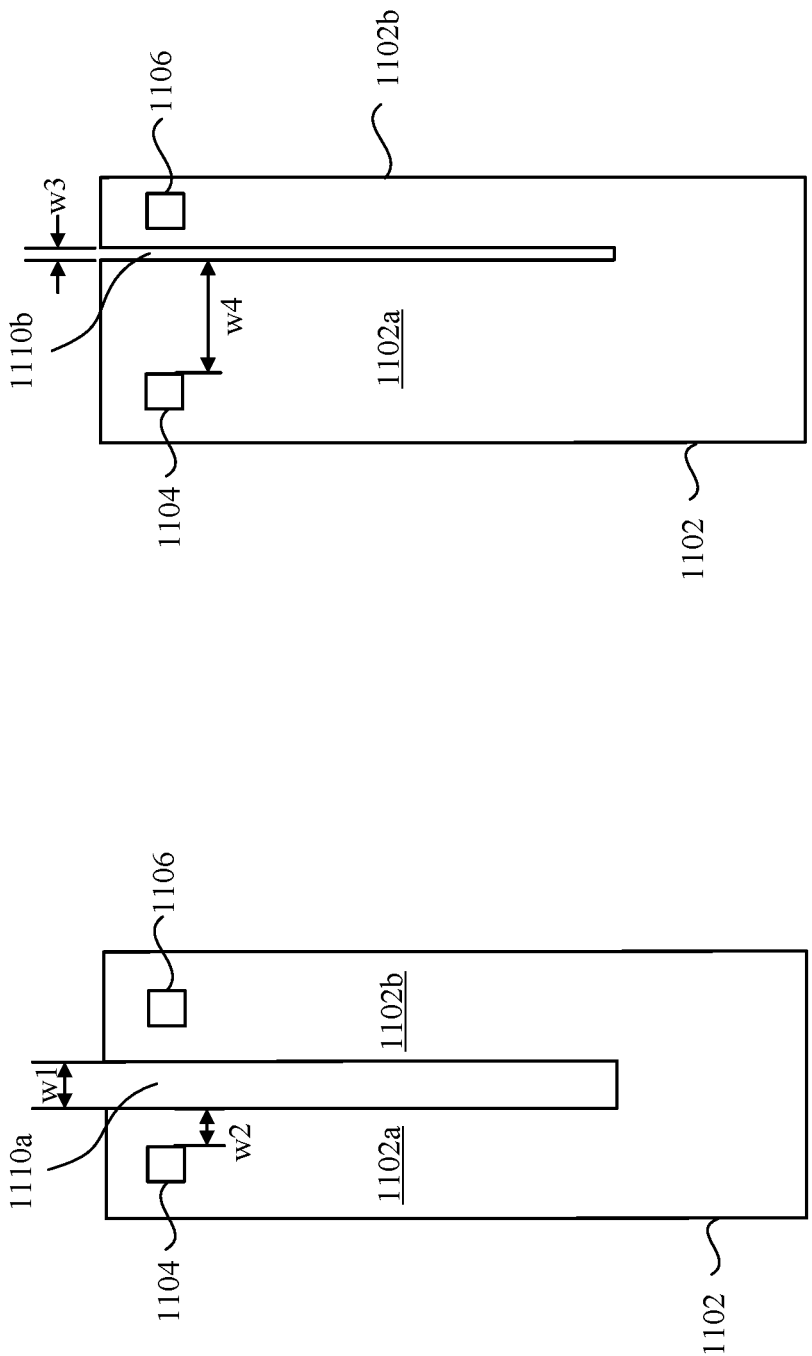

1

INTERNAL COMPONENT ARRANGEMENT WITHIN A HOUSING

CROSS-REFERENCE TO RELATED APPLICATION

This is a continuation of U.S. application Ser. No. 14/456,955, filed Aug. 11, 2014, entitled "INTERNAL COMPONENT ARRANGEMENT WITHIN A HOUSING", which is a continuation of International Application PCT/US14/50570, with an international filing date of Aug. 11, 2014, entitled "INTERNAL COMPONENT ARRANGEMENT WITHIN A HOUSING", the contents of which are incorporated herein by reference in its entirety for all purposes.

FIELD

The described embodiments relate generally to internal components of electronic devices. More particularly, the present embodiments relate to methods and apparatus for positioning and securing internal components within a housing that can deform.

BACKGROUND

Housings formed from materials such as plastics can provide a number of design challenges when adapting them for use with an electronic device due to the non-rigid nature of plastic housings. During a drop event, portions of a housing can deform allowing internal components to shift out of place, which can in some instances result in the internal components being disconnected or in extreme cases being damaged as a result. The relative ease with which a housing can deform can also result in misalignment between openings in the housing and internal components meant to align with the openings. For example, a user interface such as a button or switch that is supposed to be accessible through an opening can experience such a misalignment, thereby precluding a user from being able to properly interact with the user interface. Component misalignment and shifting are generally considered to be unacceptable attributes for an electronic device housing and can preclude the use of a housing susceptible to deformation when these attributes cannot be mitigated.

SUMMARY

This paper describes various embodiments that relate to securing components disposed within a housing.

In one embodiment, a portable electronic device is disclosed. The portable electronic device includes a pliable housing that carries a first component spaced apart from a second component. The portable electronic device also includes a retaining system coupled to the pliable housing and configured to substantially maintain a relative position of the first component with respect to the second component when a load applied to the pliable housing causes the pliable housing to deform. In one aspect of the embodiment, a protective cover is coupled to the pliable housing. The retaining system includes a retaining protrusion coupled to and extending from an interior surface of the protective cover, and a retaining member coupled with an interior surface a side wall of the pliable housing. The retaining member defines a channel that surrounds a portion of the retaining protrusion such that the retaining member and the retaining protrusion cooperate to inhibit deformation of the side wall when the load is applied to the pliable housing.

In another embodiment, a retaining system for retaining a first housing component to a second housing component of a portable electronic device is disclosed. The retaining system includes at least the following: a retaining protrusion coupled to the second housing component and extending into an interior portion of the first housing component, and a retaining member integrally formed with an interior surface of a wall of the first housing component. The retaining member is disposed within the interior portion of the first housing component and defines a channel that surrounds a first portion of the retaining protrusion thereby inhibiting movement of the first housing component with respect to the second housing component when a force is exerted on the portable electronic device.

In another embodiment, a method for reinforcing a sidewall of a portable electronic device is disclosed. The method includes at least the following steps: coupling a retaining protrusion to an interior surface of a cover component of the portable electronic device; insert-molding a retaining member to an interior surface of a housing component of the portable electronic device; and coupling the cover component to the housing component such that a first portion of the retaining protrusion is surrounded by a channel defined by the retaining member and is substantially parallel with the sidewall. The retaining member and the retaining protrusion cooperate to inhibit deformation of the sidewall when an external force is exerted on the portable electronic device.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which:

FIGS. 12A-12B show how reducing a thickness of a cut can increase a size of a portion of a flexible connector.

DETAILED DESCRIPTION

Figure 1A:
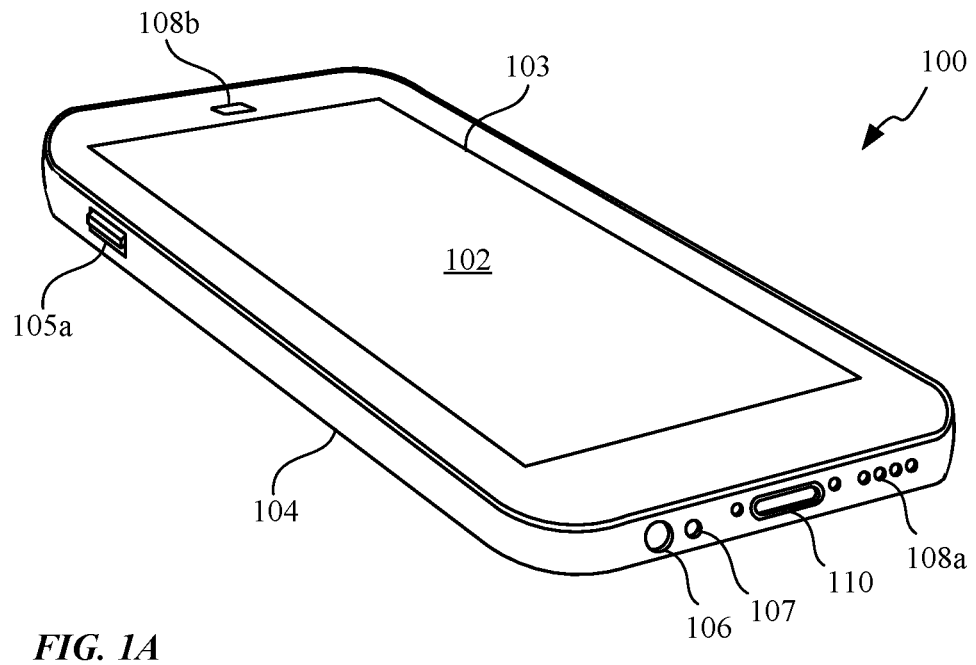
FIGS. 1A-1B show different views of a portable computing device.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Housings for portable computing devices often provide structural mounting positions for various electronic components disposed within the housing. In some cases, electronic components disposed within a housing can move or shift from their desired positions. This is particularly true for a housing formed from a material that can deform; an interior position of electronic components disposed within the housing can change when the housing deforms. One way to mitigate undesirable movement of electronic components within a housing made from deformable materials is to add a rigid interior frame member within the housing. A rigid interior frame member can increase the rigidity of the housing and at least assist in maintaining a known interval between two components mounted to the rigid interior frame member. Unfortunately, even when components are attached to the rigid interior frame member, deformation of the housing can still cause components to shift, which can induce disconnections and/or damage to the components. A likelihood of these problems can be reduced in a number of ways. For example, in some embodiments a feature can be added that can prevent or inhibit deformation of the housing and in other embodiments internal connections can be made more robust.

Board-to-board connectors are particularly vulnerable to disconnection from a PCB to which they are attached. Board-to-board connectors are typically used to transfer signals from one PCB to another. A board-to-board connector is typically a flexible cable with a connector at each end that snaps into a communication slot on each of the PCBs, thereby establishing a robust communications channel between the two PCBs. The board-to-board connectors can be utilized to attach a main logic board to other electronic components and subassemblies within the portable computing device. While in some cases board-to-board connectors include a "snap and lock" feature that can help prevent the connectors from detaching from the communication slots when the portable computing device experiences external forces (e.g., when an individual drops his or her portable computing device onto a hard surface), the "snap and lock" feature is often inadequate for this purpose, and additional reinforcing mechanisms are often required. One example of a reinforcing mechanism is a cowling that can be secured over the board-to-board connectors. The cowling can exert pressure upon at least one end of a connector to reduce a likelihood of disconnection. In this way, the cowling imparts a force against the connector that assists in retaining the connector within a communication slot. In some cases, a compressible layer along the lines of a foam pad can be disposed between the cowling and the connector to increase tolerances between the cowling and connector. Implementation of the compressible layer can be particularly beneficial when the cowling is subjected to bending forces during, for example, a drop event. In some embodiments, a shape and/or a thickness of various portions of the cowling can be optimized to prevent deformation of the cowling, thereby preventing situations in which the cowling pulls away from the connector. In some embodiments, the cowling can be selectively thickened while in other embodiments the cowling can include a number of structural rib features to increase an overall rigidity of the cowling.

In some embodiments, the aforementioned cowling can be separated from the PCB by a standoff. The standoff can be configured to provide a pathway through which a fastener can affix both the cowling and the PCB to an internal surface of the housing. In addition to providing a fixed standoff distance between the cowling and the PCB, the standoff can provide an electrically conductive pathway through which the cowling and PCB can be electrically coupled, thereby facilitating grounding of the PCB through at least a portion of the cowling.

In some embodiments, a board-to-board connector secured by the cowling can be coupled with more than one component. By splitting one end of the board-to-board connector into two portions or "tails," the tails can flex to attach to the different components. When maintaining a size of the tails is important, any waste of a portion of the flexible circuit can be highly undesirable. In such a case, minimizing an amount of material removed when splitting the tails is of great importance. In some embodiments, a small diameter laser cutter can be used to separate the tails, leaving only a small gap between the tails, on the order of about 0.025 mm, thereby increasing an effective surface area of the tails.

In some embodiments, an alignment system can be utilized to prevent undue shearing forces upon a button assembly. A switch associated with a button assembly can include a protrusion that fits in an opening of a bracket. The protrusion and opening in the bracket cooperate to anchor the switch and to prevent shearing forces from compromising a coupling between the switch and the bracket. The interaction between the protrusion and the opening also helps facilitate alignment of the switch with the bracket.

In some embodiments, a flange can be positioned to create a seal between a button disposed within an opening and a protective cover defining the opening. A thickness of the flange can be increased to prevent damage being inflicted upon the flange during repeated actuation of the button. In this particular embodiment, the flange is selectively thickened so that strengthened/thickened areas of the flange do not impinge upon areas of the portable electronic device that include other components.

In some embodiments, a rail system made up of a number of rails can be mounted directly to the interior frame member associated with the housing. The rails define a path of movement for a slide switch. In this way, the interior frame helps to define a fixed distance between the rails, thereby preventing binding of the slide switch within the rails, as might be the case for a rail system that was coupled directly to a deformable portion of the housing. Positioning of the rail system in direct contact with the internal frame member also prevents the rails from shifting in the event of an associated sidewall of the housing deforming.

In some embodiments, a sidewall of the housing includes a fastener opening for securing a protective cover that overlays a display assembly of the portable computing device to the housing. A metal plate can be utilized to guide the fastener through an opening in an insert molded component disposed between the fastener opening and a fastening feature (sometimes referred to as a fang) extending from the display assembly. The metal plate can be positioned within the housing by adhesively coupling it to the insert molded part positioned proximate the fastener opening. In situations where an opening in the metal plate and the fastener opening are not well aligned, or where the housing shifts substantially with respect to the metal plate, the fastener can experience undesirable shearing forces or in some instances be unable to couple with the fastening feature of the display assembly. By adhering the metal plate to the insert molded part with low shear adhesive, the metal plate can shift with respect to the insert molded part to allow the fastener to engage the fastening feature during an assembly operation.

In some embodiments, flexible sidewall portions of a housing can be reinforced by a number of retaining members (in some instances referred to as retaining knuckles). The retaining members can be disposed within the housing as follows. A retaining member that defines a retaining channel can be insert molded along an inside surface of a sidewall of the housing. A protrusion having a size and shape in accordance with the retaining channel can be formed along an inside surface of a rigid protective cover that overlays a display assembly. When the protective cover is mated with the housing, the protrusion is seated within the retaining channel so that the protrusion is operable to prevent deformation of the sidewall by interacting with the retaining members defining the retaining channel.

In some embodiments, a C-washer can be used to provide precise vertical alignment of a docking connector with an opening in a housing. The C-washer can be a C-shaped plate having an interior diameter and exterior diameter. In some embodiments the C-washer can have a curvature that causes one pair of diametrically opposing high points disposed around the interior diameter of the C-washer to be oriented in a first direction and another pair of diametrically opposing high points to be oriented in a second direction opposite the first direction. The diametrically opposing high points enable the C-washer to make even contact with objects disposed both above and below it. In some embodiments, the C-washer can have four, six or even eight high points. The C-washer can be formed of any number of electrically conductive materials such as for example, spring steel, beryllium copper, and titanium copper.

In some embodiments, a carrier tab can be utilized to align a component within a portion of the portable computing device. The carrier tab can include one or more breakaway holes that facilitate removal of a breakaway portion of the carrier tab. In this way, a robotic arm or similar holding apparatus that can be a part of a computer aided manufacturing system can hold the breakaway portion of the carrier tab while the remainder of the carrier tab is coupled with an interior surface of the portable computing device and the component. Subsequent to installing the carrier tab, the breakaway portion can be removed. In some embodiments, the carrier tab can be operative to secure one end of a flexible circuit within the portable computing device.

These and other embodiments are discussed below with reference to FIGS. 1A-13; however, those skilled in the art will readily appreciate that the detailed description given herein with respect to these figures is for explanatory purposes only and should not be construed as limiting.

Figure 1B:
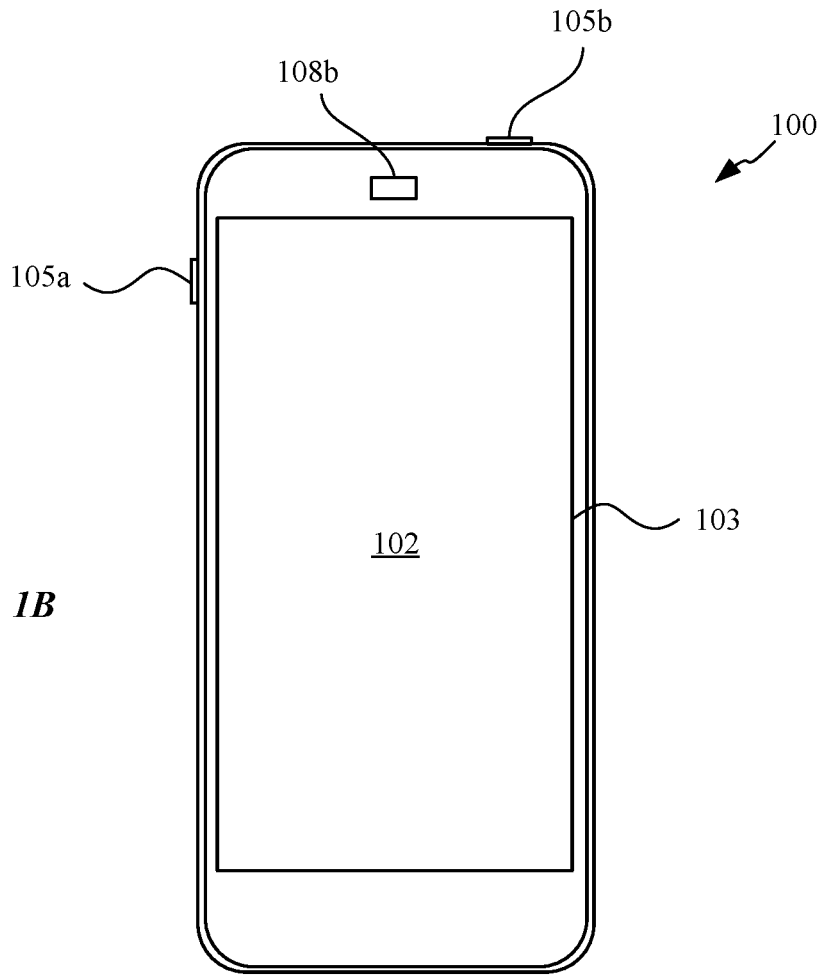

FIGS. 1A and 1B show different views of portable computing device 100. FIG. 1A shows a perspective view of portable computing device 100 and FIG. 1B shows a top view of portable computing device 100. Although embodiments herein depict portable computing device 100 taking the form of a mobile phone, this is for illustrative purposes only and it should be appreciated that portable computing device 100 can take the form of other devices. By way of non-limiting example, portable computing device 100 can also be embodied as a tablet computing device, a user interface device, a media player, and/or any other electronic device that can include a flexible housing enclosure.

Portable computing device 100 can include protective cover 102 and housing 104. Housing 104 can include a number of walls, including a bottom wall and a number of sidewalls, which cooperate to define a cavity for housing internal components of portable computing device 100. Housing 104 can be made at least in part from materials that have elastic deformation properties. In this regard, portions of housing 104 can temporarily deform when a force is exerted upon housing 104 and return to its original shape after the force is removed. For example, a portion of housing 104 can deform by compression, expansion, bowing, and/or flexing. Housing 104 can be made from polymers such as plastic that can have a high elastic limit. In one embodiment, housing 104 is formed from a unitary piece of plastic. Portions of housing 104 can vary in thickness and rigidity. In this regard, some portions of housing 104 can be substantially rigid while other portions can be more flexible.

A front opening of the cavity defined by a top inside edge of the sidewalls of housing 104 can receive protective cover 102. For example, protective cover 102 can be received and coupled to housing 104 by friction fitting, one or more fastening systems, and/or a combination thereof. In this regard, when assembled, housing 104 and protective cover 102 cooperate to enclose components of portable computing device 100. In some embodiments, an enclosed component can be used to assist in the alignment and positioning of other components of portable computing device 100. In one specific embodiment, portable computing device 100 can include an interior frame member (not depicted) that helps to reinforce housing 104 and to provide a rigid structure upon which other components can be mounted. In this way, spacing between internal components mounted with the rigid frame member can be improved.

In some embodiments, a component can be a user interface that provides a user of portable computing device 100 with input/output (I/O) functionality. For example, protective cover 102 can include display assembly system 103 disposed between protective cover 102 that provides a touch-screen driven user interface. Portable computing device 100 can also include one or more tactile interfaces such as button assembly 105a and button assembly 105b that can be disposed on the sides of portable computing device 100. Portable computing device 100 can also include one or more audio interfaces such as headphone jack opening 106, microphone opening 107 and a number of speaker openings 108a that can be disposed along one of the sidewalls of housing 104. Another speaker opening 108b can be disposed along a top surface of protective cover 102. Furthermore, portable computing device 100 can include a data connector having an exterior opening defined by trim ring 110 that is also disposed along one of the sidewalls of housing 104.

Figure 1C:
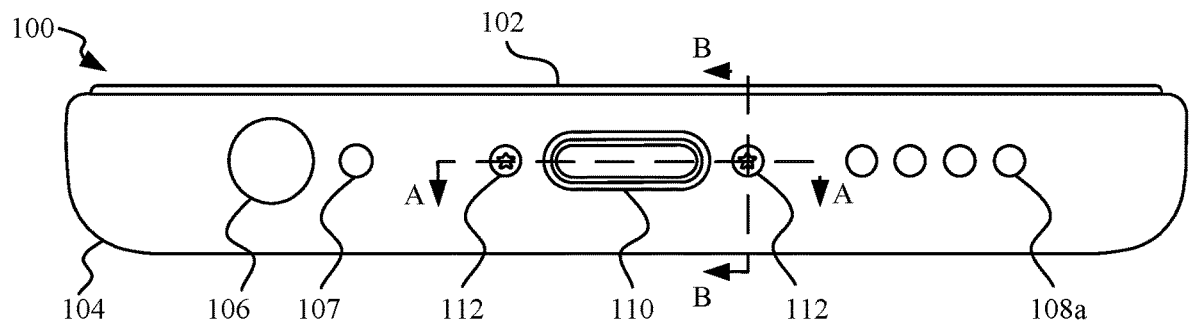
FIGS. 1C-1F show how fastening features of a protective cover can be coupled to a housing of the portable computing device.

FIGS. 1C-1F show a number of views of a bottom portion of portable computing device 100. FIG. 1C in particular shows an external view of a sidewall of housing 104 of portable computing device 100. Protective cover 102 that overlays display assembly system 103 is joined to housing 104 at least in part by fasteners 112. Fasteners 112 can be electrically conductive metal fasteners formed from any number of materials, including for example stainless steel, carbon steel, aluminum, copper, brass or phosphorous bronze. In some embodiments, protective cover 102 can be formed from a layer of high strength glass, sapphire or other high strength transparent material. Fasteners 112 pass through openings in housing 104 to engage fastening features (not depicted in FIG. 1C) extending from an inside surface of protective cover 102, thereby securing protective cover 102 to housing 104. A data connector opening is also depicted, the data connector opening being defined by trim ring 110. When a portion of housing 104 surrounding the data connector opening is flexible, trim ring 110 can be formed from a rigid material that reinforces the opening and prevents deformation of the opening leading into the data connector. In this way, trim ring 110 can provide an opening through the flexible portion of housing 104 that operates to maintain a size and shape of the opening in accordance with a data connector plug that engages a data connector assembly disposed within housing 104. FIG. 1C also depicts headphone jack opening 106, microphone opening 107 and speaker openings 108a.

Figure 1D:
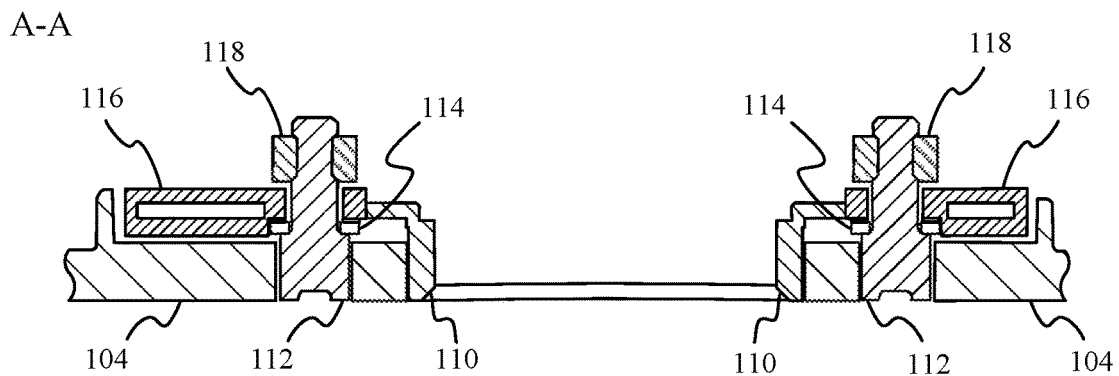

FIG. 1D shows a partial cross-sectional view of portable computing device 100 in accordance with section line A-A as depicted in FIG. 1C. Fasteners 112 are disposed through fastener openings in housing 104. Fasteners 112 also pass through openings in reinforcement plates 114 which are adhesively coupled with insert molded part 116. Reinforcement plates 114 help to guide fasteners 112 through insert molded part 116 and towards fastening features 118 (in some cases referred to as protective cover fangs). In some embodiments, fasteners 112 can be utilized to form openings in insert molded part 116 during initial assembly of portable computing device 100. Without the alignment provided by reinforcement plates 114, formation of the opening during initial assembly can cause portions of insert molded part 116 to be destroyed in instances where fasteners 112 are driven through insert molded part 116 at an incorrect angle. The adhesive coupling between insert molded part 116 and reinforcement plates 114 can be formed by a low shear adhesive that allows reinforcement plates 114 to shift slightly with respect to insert molded part 116 while fasteners 112 are engaging fastening features 118. This ability of reinforcement plates 114 to shift prevents reinforcement plates 114 from preventing precise alignment of fasteners 112 with fastening features 118 in cases of slight misalignment of reinforcement plates 114 due to sample variation in component parts and/or tolerances inherent to the assembly process.

Reinforcement plates 114 can be formed from any high strength material such as, for example, stainless steel or carbon steel. Fasteners 112 engage with openings in fastening features 118 to secure protective cover 102 to housing 104. Fastening features 118 can be metal protrusions having threaded openings configured to retain fasteners 112. Insert molded part 116 can be formed of an insulating material such as plastic or foam that electrically isolates reinforcement plates 114, fasteners 112 and fastening features 118 from trim ring 110. This can be of particular importance when a data connector plug is engaged within trim ring 110, thereby grounding trim ring 110 through the data connector plug. This grounding can cause electromagnetic interference to be generated at trim ring 110, which can in turn affect sensitive components such as antennas proximate to trim ring 110. By insulating the aforementioned components from trim ring 110, these additional electrically conductive components can be prevented from also being grounded to the data connector plug through trim ring 110, thereby minimizing an amount of electromagnetic interference generated by the electrical coupling between the data connector plug and trim ring 110.

Figure 1E:
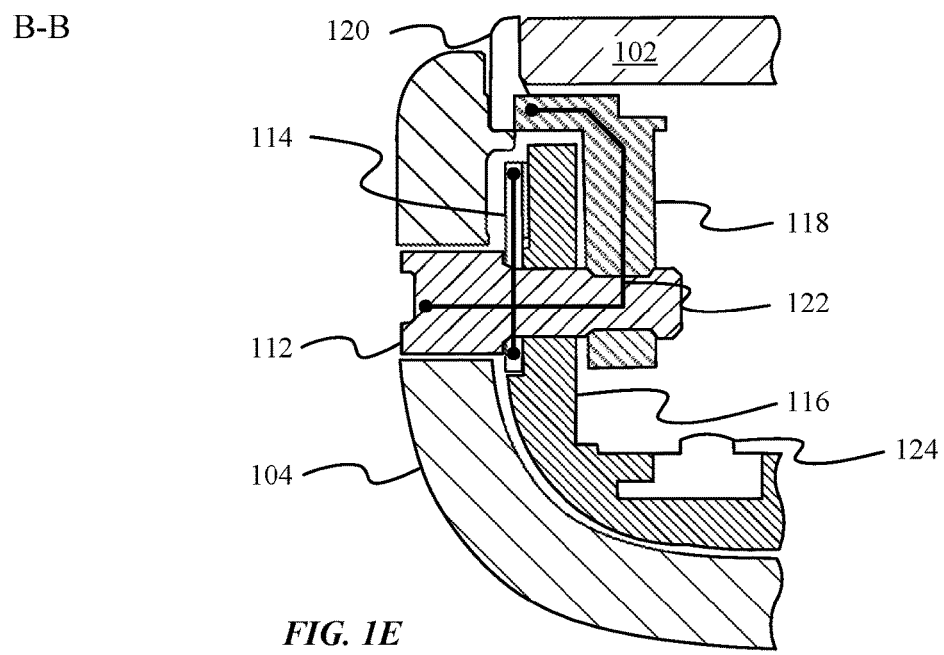

FIG. 1E shows a partial cross-sectional side view of portable computing device 100 in accordance with section line B-B as depicted in FIG. 1C. Fastening features 118 are joined with and extend from a bottom surface of protective cover 102 and into an interior portion of housing 104. Fastening features 118 can be electrically conductive and are joined to protective cover 102 by a sealing member 120 that is electrically insulating. Sealing member 120 can be formed from materials along the lines of plastic or rubber. Protective cover 102 is also generally formed of insulating material along the lines of glass or sapphire, which can also prevent electrical coupling between electrical components associated with protective cover 102 and fastening features 118. Positioning of fastening features 118 in this manner allows fastening features 118 to be aligned with fastener openings in housing 104 without being electrically coupled to electrical components associated with protective cover 102. Fastener 112 is depicted passing through a fastener opening in housing 104 and an opening in fastening feature 118, thereby coupling protective cover 102 to housing 104. Electrically conductive pathway 122 depicts a potential flow of electrical energy through fastener 112, reinforcement plate 114 and fastening feature 118. As can be seen, insert molded part 116, housing 104 and sealing member 120 effectively insulate these components so that if fastener 112 receives an electrostatic discharge the electrical energy is not propagated to electrically sensitive components. Furthermore, the insulating components prevent these electrically conductive elements from being included in a grounding path through the trim ring (shown in FIG. 1D). This can be particularly beneficial in this embodiment, given the short distance between fastening feature 118 and antenna 124.

Figure 1F:
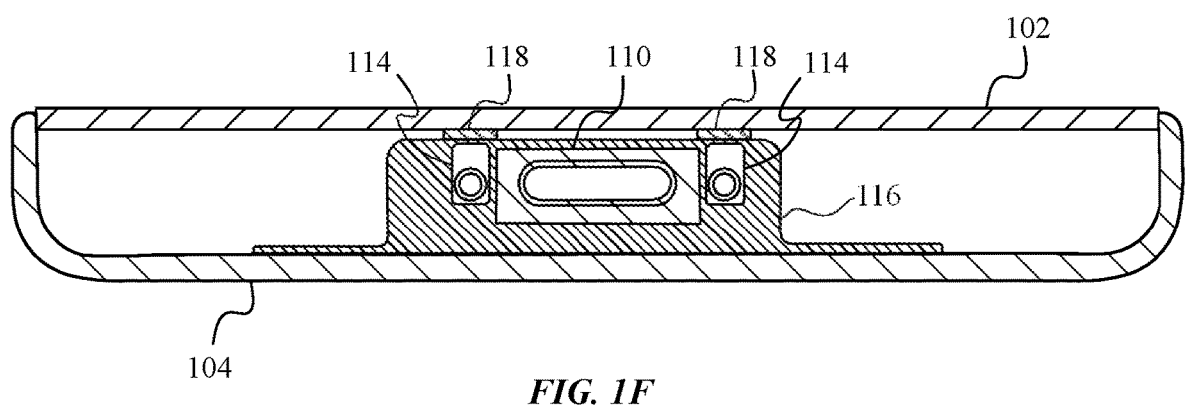

FIG. 1F shows an internal, cross-sectional view of the bottom portion of portable computing device 100. In this view, a shape and size of insert molded part 116 is depicted in relation to trim ring 110. FIG. 1F depicts separation between trim ring 110 and reinforcement plates 114. Additionally, fastening features 118 are depicted extending above insert molded part 116.

Figure 2A:
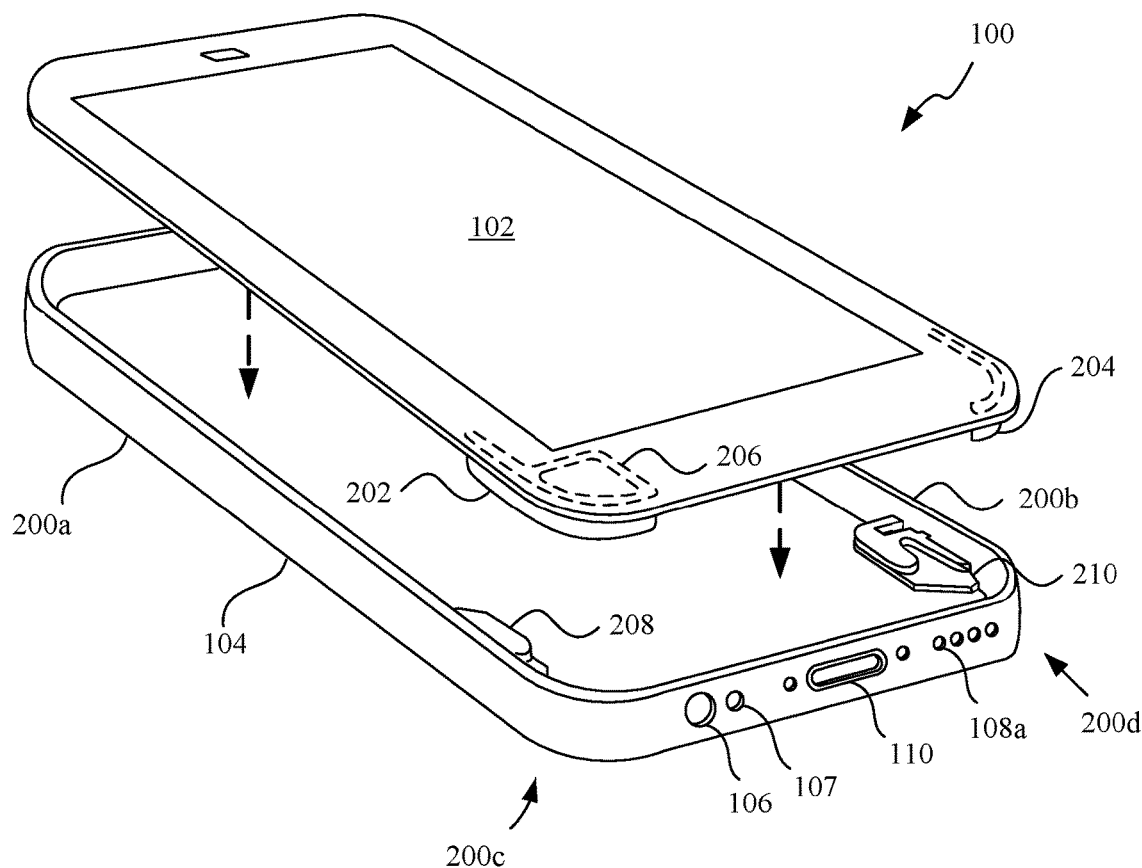
FIGS. 2A-2B show views of a retaining system configured to inhibit deformation of sidewalls of the portable computing device.
Figure 2B:
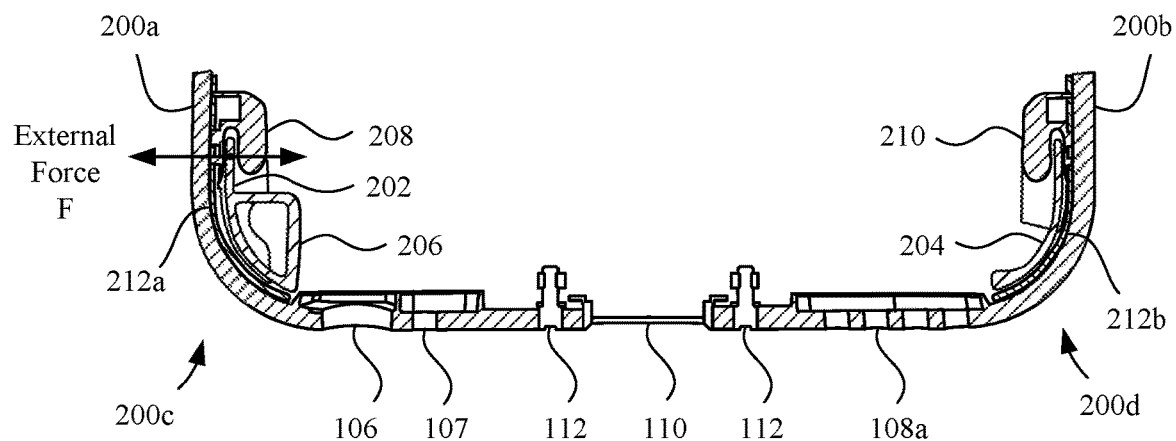

FIGS. 2A-2B show how a retaining system can be utilized to inhibit sidewalls of housing 104 from bowing outwards and away from protective cover 102 when an external force is received at housing 104. A drop event can impart a force on housing 104 that causes sidewalls 200a, 200b of housing 104 to bow outwards, particularly when portable computing device 100 is dropped on a corner, e.g., corner regions 200c/200d, of housing 104. The impact from dropping portable computing device 100 on a corner can result in a propagation of the force from the drop to at least one of sidewalls 200a and 200b, causing at least one of sidewalls 200a, 200b to deform. Deformation of sidewalls 200a, 200b can result in outward bowing of the sidewalls. Outward bowing of a sidewall can increase the volume of housing 104, allowing internal components to shift during a drop event, which can in many cases cause damage or compromise the functionality of the internal components. For example, outward bowing can cause components associated with headphone jack opening 106, microphone opening 107 and speaker openings 108a to shift thereby causing a misalignment with their corresponding openings. Misalignment with the corresponding opening can compromise the functionality of the component. Shifting of internal components can also cause disconnection of interior components, thereby disabling the disconnected interior components.

FIG. 2A shows how protrusions 202 and 204 can extend from a bottom surface of protective cover 102. The protrusions can take on different shapes. In some cases, as depicted, protrusion 202 can include a strengthening feature 206 that increases a lateral rigidity of protrusion 202. For example, strengthening feature 206 can have a closed shaped disposed at one end of protrusion 202 that reinforces protrusion 202. In other cases, as depicted, protrusion 204 can have a more linear shape to fit between other components disposed within housing 104. Protrusions 202 and 204 can each have portions that are substantially parallel with portions of cover component 102. For example, a linear portion of protrusion 202 can be substantially parallel with an edge of cover component 102, and a curved portion of protrusion 204 can be substantially parallel with a corner portion of cover component 102. Portions of the protrusions can also be substantially parallel with portions of housing 104. For example, a portion of protrusion 202 can be substantially parallel with sidewall 200a. In some embodiments, protrusions 202 and/or 204 can be coupled to protective cover 102 with an adhesive. In other embodiments, protrusions 202 and/or 204 can be coupled to protective cover 102 with a fastening system along the lines of a screw and threaded opening.

As protective cover 102 mates with housing 104, protrusions 202 and 204 cooperate with corresponding retaining members disposed in housing 104 to reinforce sidewalls 200a, 200b. It should be noted that FIG. 2A depicts protective cover 102 having protrusions disposed in only two corners; however, in other embodiments protrusions and corresponding retaining members can be disposed at other locations within portable computing device 100. For example, protrusions and retaining members can be disposed in each of the corners of housing 104. In another example, protrusions and retaining members can cooperate to reinforce other portions of a sidewall such as a central portion of sidewalls 200a, 200b and/or the sidewall between corner portions 200c and 200d. In yet another example, a protrusion and a retaining member can be disposed at a central portion of the portable computing device 100. Furthermore, a protrusion can be retained by more than one retaining member. For example, a first portion of a protrusion can be retained by a retaining member at one corner while a second portion of the protrusion can be retained by another retaining member disposed at another corner. Similarly, a retaining member can retain more than one protrusion. For example, a retaining member can define two or more channels for retaining more than one protrusion. Any number of protrusions and retaining member can be used. It is particularly useful to position protrusions and retaining members along portions of housing 104 that are likely to deform during a drop event.

FIG. 2B shows a partial cross-sectional view of portable computing device 100 when protective cover 102 is mated with housing 104. A portion of protrusion 202 is disposed within a channel formed by retaining member 208. The channel formed by retaining member 208 can have a shape that is complementary to a portion of protrusion 202, allowing the channel to surround a portion of protrusion 202. In this way, protrusion 202 can restrict movement of retaining member 208 when sidewall 200a is deformed. Similarly, protrusion 204 can restrict movement of retaining member 210 when sidewall 200b is deformed. Retaining members 208 and 210 can be integrally formed with housing 104. For example, retaining members 208 and 210 can be formed along an inside surface of housing 104 using insert molding techniques. In some embodiments, both retaining members 208, 210 and protrusions 202, 204 can be formed from rigid material along the lines of glass filled nylon. In some embodiments, retaining members 208 and 210 can be reinforced in part by reinforcement features 212a and 212b respectively. Reinforcement features 212a, 212b can be, for example, at least a portion of a rigid interior frame member disposed within housing 104. The rigid interior frame member can be particularly effective at preventing inward deformation of housing 104 when housing 104 is subjected to an external force.

Protrusion 202 cooperates with retaining member 208 to prevent substantial movement of sidewall 200a when subjected to an external force F. In this embodiment, retaining members 208 and 210 are disposed within corner regions 200c and 200d respectively. As previously discussed, dropping portable computing device 100 on a corner can cause, for example, corner region 200c to be compressed. Without the benefit of retaining member 208, the compression at corner region 200c can be transmitted along sidewall 200a, potentially causing damage or shifting of components disposed proximate to sidewall 200a. By positioning the retaining members 208 and 210 at the corner regions 200c and 200d respectively, a force exerted on a corner can be mitigated or absorbed by retaining members 208 and 210, thereby preventing energy imparted during the drop from propagating to sidewalls 200a and 200b. In this way, the retaining members can prevent substantial deformation of sidewalls 200a and 200b when portable computing device 100 is exposed to an external force. It should be noted that this configuration is particularly effective when protective cover 102 is formed from a material that is more rigid than materials used to form housing 104. For example, when protective cover 102 is formed from a rigid material such as glass which is unlikely to substantially deform during a drop event, protective cover 102 can keep protrusions 202 and 204 firmly in place, thereby preventing retaining members 208 and 210 and the attached sidewalls from deforming. It should be noted that glass is generally known to be particularly robust in tension, making it an excellent anchor for protrusions 202 and 204 during a drop event.

Figure 3A:
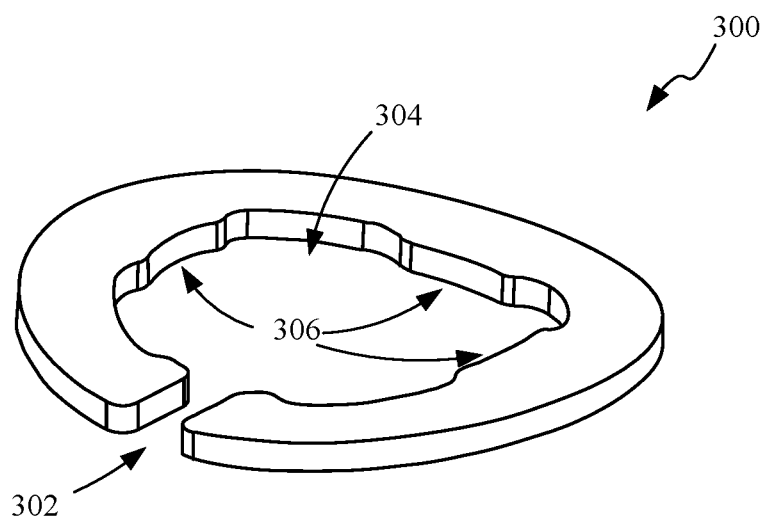
FIGS. 3A-3E show various C-washer configurations that can be utilized to seat an electrical component at a desirable vertical position.
Figure 3B:
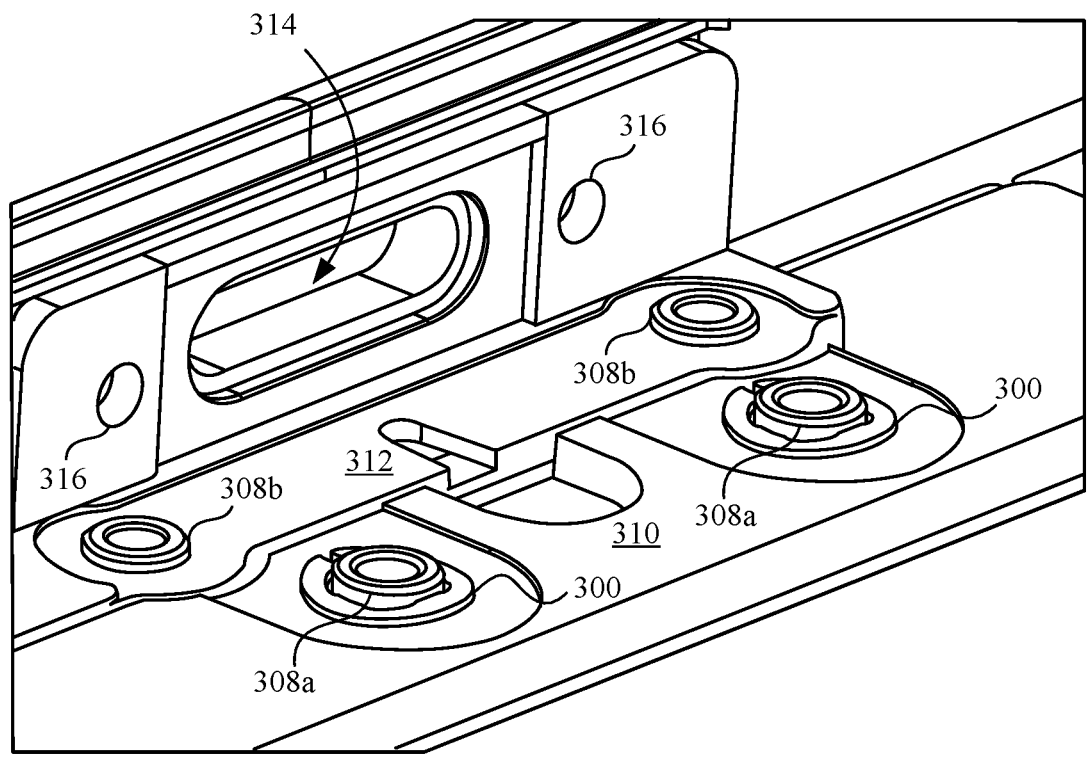

FIGS. 3A-3B show a C-washer 300. C-washer 300 can be a disc-shaped plate having a front opening 302 and center opening 304. C-washer 300 can be made from conductive materials such as steel, cooper, or conductive plastic. In this regard, C-washer 300 can provide an electrical path for objects that are contacting C-washer 300. For example, C-washer 300 can be used to ground components that contact C-washer 300. In other embodiments, C-washer can be made from non-conductive materials.

Front opening 302 allows C-washer 300 to be deformed so that center opening 304 is temporarily expanded so that C-washer 300 can surround an object. For example, C-washer 300 can surround a fastening device such as a screw, nut, or boss. To receive these objects, C-washer 300 can be opened by applying a force that increases a size of center opening 304 so that it is large enough to surround an object. When the object is received and the deforming force is removed, the C-washer 300 can "snap" back into its original shape thereby causing interior protrusions 306 to exert a force upon a peripheral surface of the object that keeps the C-washer firmly in place around the object. The elastic properties that allow C-washer to open and return back to its original shape can be provided by the materials used to form C-washer 300. In this regard, unlike traditional washers, C-washer 300 retains itself to an object, thereby decreasing the likelihood of C-washer 300 being inadvertently removed from the object it retains. This feature is particularly useful during an assembly process when movement and rotation of components can cause C-washer 300 to fall off the object. Center opening 304 can be defined by an interior surface of C-washer 300 that includes a number of interior protrusions 306. Protrusions 306 can be diametrically opposed so that when C-washer 300 is compressed by a surface of a component, protrusions 306 self-level so that force exerted by the component on the C-washer is evenly distributed. Also depicted is how one pair of protrusions point in one direction while the other set of protrusions point in another direction by virtue of an overall curvature of C-washer 300.

FIG. 3B shows an exemplary use of a number of C-washers 300. C-washers 300 are depicted as being retained around bosses 308a which are disposed along an interior surface 310. Bosses 308b are disposed along interior surface 312 that is positioned above interior surface 310. In this regard, bosses 308b are disposed above bosses 308a. During an assembly operation, a component such as a data connector assembly (not shown) can be installed using bosses 308a and 308b. When assembled, the data connector is aligned with opening 314 and engaged with bosses 308a and bosses 308b. Furthermore, the data connector assembly can also be secured to a sidewall of the housing by a fastener that is driven through openings 316 and an attachment feature associated with the data connector assembly.

Because C-washers 300 are configured to deform, an amount of engagement between C-washers 300 and the data connector assembly can be adjusted or tuned during an assembly operation. A position of an opening of the data connector assembly can be changed by adjusting the amount of engagement between the C-washers and the data connector assembly so that an opening in the data connector assembly aligns with opening 314. Furthermore, this type of adjustment can help to align fastening features of the data connector assembly with openings 316. In some embodiments, it may be desirable to reduce an amount of compression applied to C-washers 300 to increase a height at which the data connector assembly engages bosses 308a so that the data connector assembly engages bosses 308a and 308b within the same vertical plane. In this regard, C-washers 300 can also be especially helpful when component-to-housing tolerances are such that a slight vertical height adjustment may be necessary. In some configurations, bosses 308a can include a lip that engages with protrusions 306. In this way, the lip can help to keep C-washers 300 from sliding off of bosses 308a. In other configurations, protrusions 306 can engage an outside surface of bosses 308a to maintain C-washers 300 in place during assembly, obviating the need for a lip feature on bosses 308a.

Figure 3C:
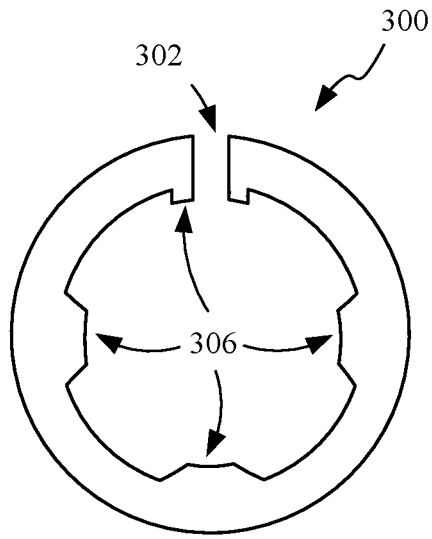
Figure 3D:
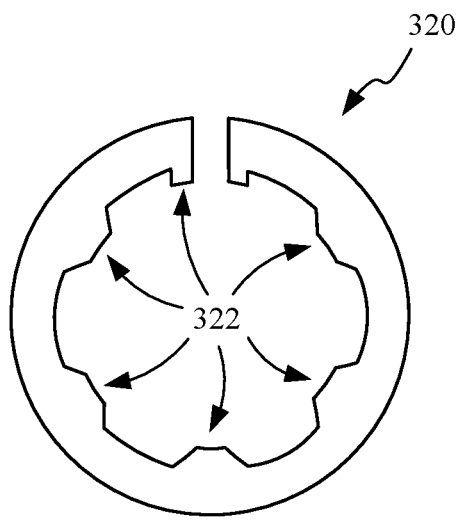
Figure 3E:
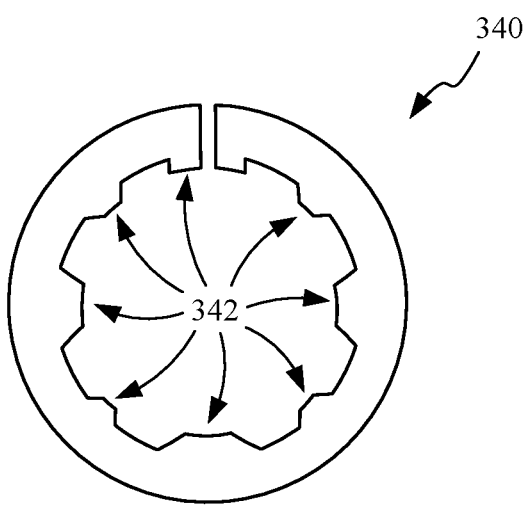

FIGS. 3C-3E show top views of a number of alternative configurations in which the C-washers can be formed. FIG. 3C shows a top view of C-washer 300 of FIG. 3A. C-washer 300 includes two sets of diametrically opposed protrusions 306 that face one another. FIG. 3D shows a top view of C-washer 320 with three sets of diametrically opposed protrusions 322 facing one another. FIG. 3E shows a top view of C-washer 340 with four sets of diametrically opposed protrusions 342 facing one another.

Figure 4A:
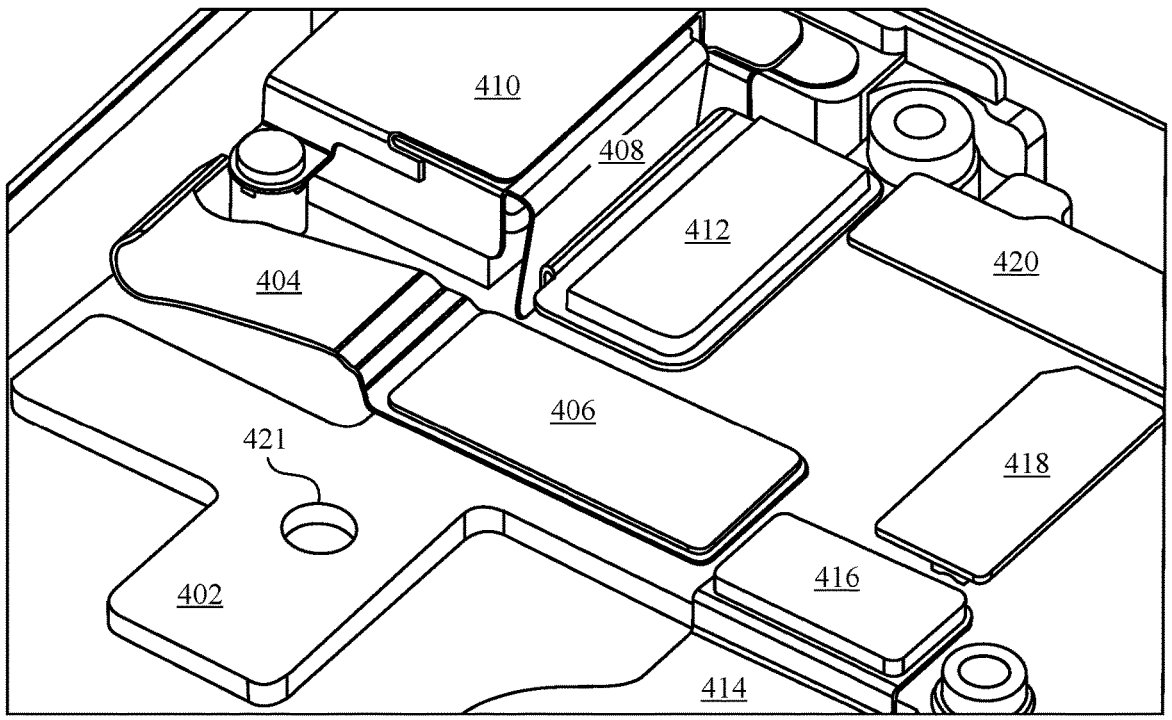
FIGS. 4A-4B show internal perspective views of a number of board-to-board connectors and a cowling for retaining the board-to-board connectors within communication slots of a printed circuit board.
Figure 4B:
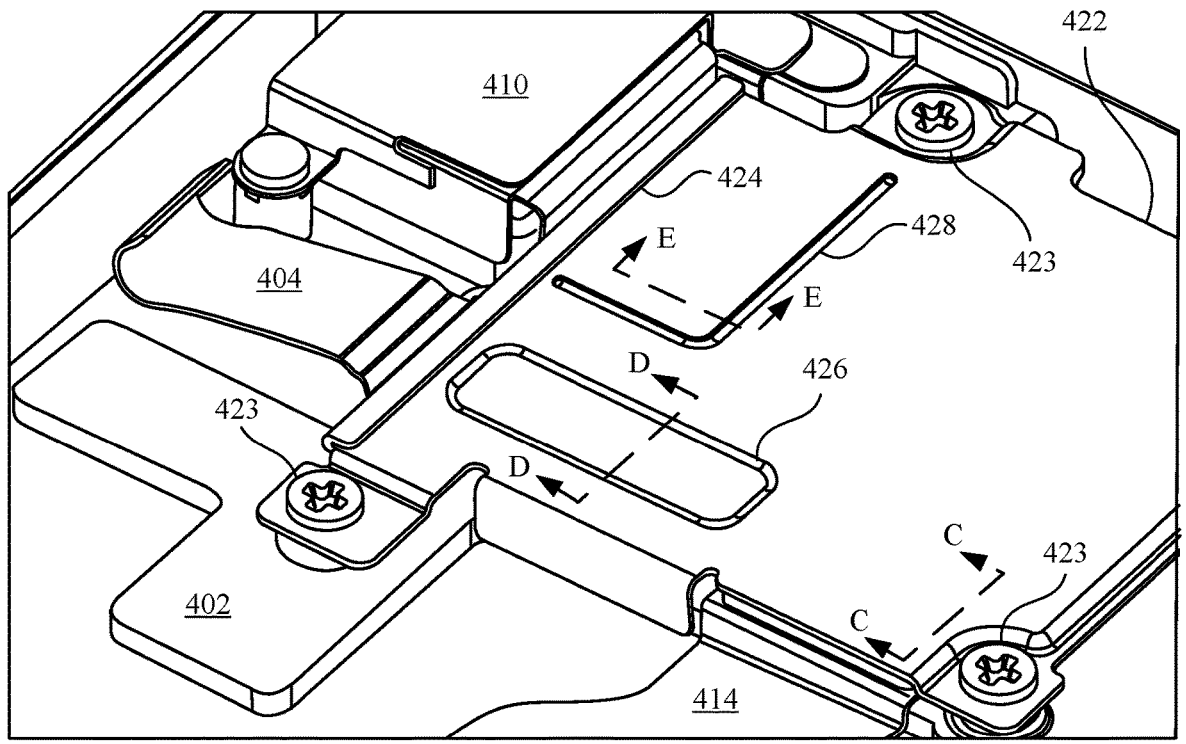

FIGS. 4A-4B show internal perspective views of an interior portion of portable computing device 100. FIG. 4A shows a main logic board (MLB) 402 configured to support a number of electronic components such as integrated circuits along the lines of central processing units (CPU) and graphics processing units (GPU). MLB 402 can be electrically coupled to other subassemblies and printed circuit boards disposed in various positions within portable computing device 100 by a number of board-to-board connectors. For example, board-to-board connector 404 is depicted mating with a communication slot disposed on MLB 402. Compressible layer 406 is disposed atop board-to-board connector 404. In some embodiments, compressible layer 406 can be formed of conductive foam. When a retaining member, such as a cowling, compresses compressible layer 406 a preload is established between the retaining member and compressible layer 406. In one embodiment, the opposite end of board-to-board connector 404 can electrically couple MLB 402 with display assembly 103. Similarly, board-to-board connector 408 can couple MLB 402 to a camera module disposed within camera module cowling 410. Similar to board-to-board connector 404, board-to-board connector 408 can also have a compressible layer 412 disposed over the end that is electrically coupled with MLB 402. Board-to-board connector 414 can be configured to electrically couple MLB 402 with other components such as button assemblies and sensors. In some embodiments, board-to-board connector 414 associated with compressible layer 416 can pass underneath a battery assembly (not shown) to couple with various other components disposed within portable computing device 100. It should be noted that other connectors are also depicted and are associated with compressible layers 418 and 420. It should be noted that MLB 402 could also include various mounting points such as, for example, opening 421 for receiving other components or shielding elements.

FIG. 4B shows a cowling 422 disposed atop MLB 402 of FIG. 4A. Cowling 422 can be secured atop MLB 402 with a number of fasteners 423. In some embodiments, fasteners 423 can be threaded screws that are secured within threaded openings. As depicted, cowling 422 is fastened to MLB 402 in a number of different positions so that it is securely positioned with respect to MLB 402. Cowling 422 can be a metal substrate having one or more substantially flat regions. In one embodiment, cowling 422 can be formed from a piece of sheet metal having a thickness of less than 0.5 mm. In another embodiment, cowling 422 can have a thickness of about 0.3 mm. Cowling 422 can be formed from metals including, but not limited to, stainless steel and aluminum.

Once cowling 422 is positioned it can assist in holding the various board-to-board connectors depicted in FIG. 4A against communication slots of MLB 402. In some embodiments, a flat region of cowling 422 can exert a force on a board-to-board connector through a compressible layer, thereby holding the board-to-board connector against a communication slot. The flat region can have a shape and size in accordance the compressible layer (e.g., compressible layer 412). In this regard, compressible layers are compressed between cowling 422 and a corresponding board-to-board connector when the cowling 422 is secured to MLB 402. As discussed in further detail below, non-flat regions of cowling 422 can also exert a force on board-to-board connectors. In some embodiments cowling 422 can also be operative to form a faraday cage that shields various components disposed beneath it from other components disposed within portable computing device 100. Unfortunately, cowling 422 can be subject to deformation during a drop event. Deformation of cowling 422 can reduce its effectiveness as a retaining member for the board-to-board connectors.

To reduce the severity of the deformities, cowling 422 can also include various reinforcing features, such as folded end portion 424. Folded end portion 424 can substantially strengthen one end of cowling 422 making deformation of the end on which it is disposed much less prone to deformation during a drop event. Furthermore, structural ribs 426 and 428 can be formed along cowling 422 by a machining operation such as stamping to provide improved rigidity to cowling 422. The stamping operation itself can increase rigidity of cowling 422 as it is operative as a cold working operation. In the depicted embodiment, structural rib 426 contacts a top surface of compressible layer 406, while structural rib 428 lies just outside of a top surface of compressible layer 412. In this regard, structural rib 428 surrounds two sides of compressible layer 412 and partially surrounds a portion of an end of board-to-board connector 408. When structural rib 428 is disposed outside of an area taken up by compressible layer 412, then compressible layer 412 can be substantially thicker. This is one reason why compressible layer 412 is depicted as being thicker than compressible layer 406, since a portion of cowling 422 disposed above compressible layer 412 has a lower height due to structural rib 426. In one embodiment, structural ribs can be placed in locations along cowling 422 in accordance with a heat map generated by finite element analysis. While substantially linear structural ribs are depicted, almost any shape is possible. The heat map can help identify portions of the cowling that undergo higher levels of stress. In this way, ideal locations for the structural ribs can be identified, thereby minimizing a number of ribs required to stiffen cowling 422. It should also be noted that while each of the structural ribs extends towards MLB 402, in some embodiments the structural ribs can extend upwards and away from MLB 402 when space is available.

Figure 4C:
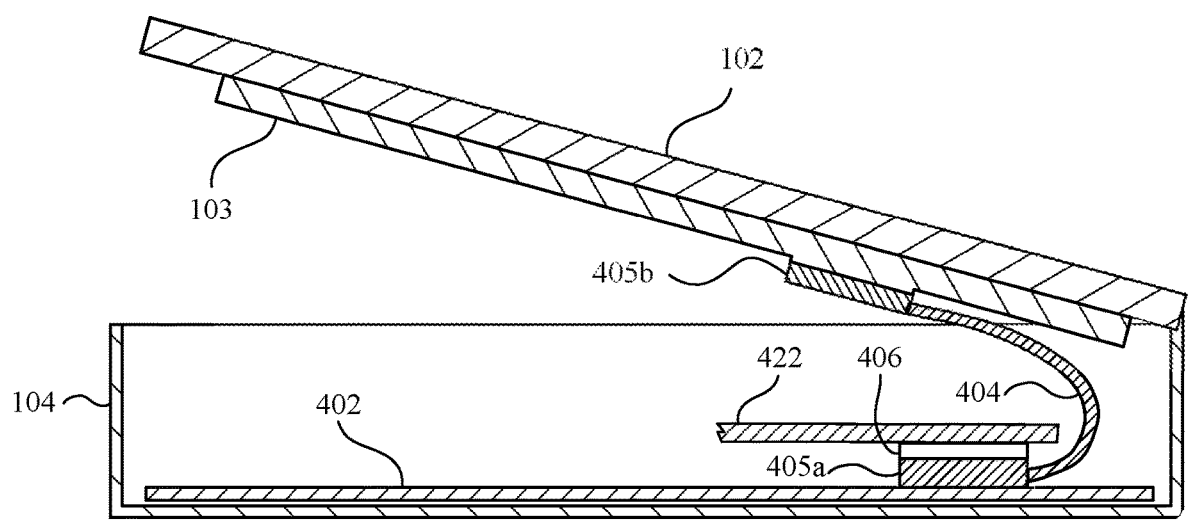
FIG. 4C shows a cross-sectional side view of the electronic device when it is partially open.

FIG. 4C shows a cross-sectional side view of portable computing device 100 when partially open in accordance with one embodiment. In this regard, protective cover 102 is tilted at an angle with respect to housing 104. This angular positioning of protective cover 102 can be appropriate for assembling protective cover 102 with housing 104. Board-to-board connector 404 includes connector 405a at one end and connector 405b at another end. Connector 405a can be coupled to a communication slot disposed on MLB 402. Cowling 422 and compressive layer 406 are disposed over a portion of connector 405a. A portion of board-to-board connector 404 is flexed upward such that connector 405b can be positioned and coupled to a communication slot disposed on display assembly 103. In this regard, board-to-board connector 404 electrically couples MLB 402 and display assembly 103.

As previously discussed, cowling 422 can be used to assist in the retention of board-to-board connectors. In this embodiment, cowling 422 (partially depicted in FIG. 4C) can retain board-to-board connector 404 to assist in keeping connector 405a connected to the communication slot disposed on MLB 402. In some cases, a drop event can cause connector 405a to disconnect from MLB 402. For example, a drop event can cause protective cover 102 to separate from housing 104, which in turn pulls connector 405a from the communication slot disposed on MLB 402. In another example, a drop event can cause the sidewalls of housing 104 to bow outwards, allowing MLB 402 to shift from its original position which can cause disconnection. Accordingly, when cowling 422 retains board-to-board connector 404, particularly at connector 405a, cowling 422 can prevent disconnection of connector 405a from MLB 402 during a drop event.

Figure 4D:
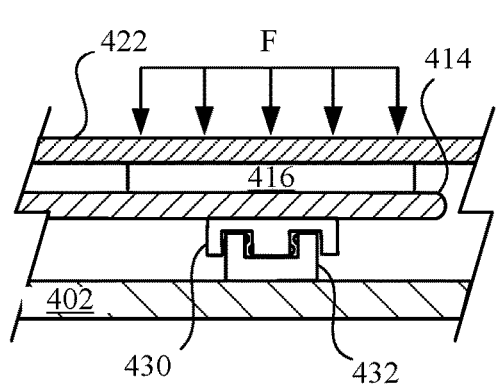
FIGS. 4D-4H show cross-sectional side views of a cowling applying a seating force against a compressible layer disposed atop one end of a board-to-board connector.

FIGS. 4D-4H show cross-sectional side views of various configurations in which foam layers are depicted interacting with cowling 422 to secure a board-to-board connector against MLB 402. FIG. 4D shows a cross-sectional side view of connector 430 of board-to-board connector 414. Similar to connector 405a, connector 430 electrically couples board-to-board connector 414 with communication slot 432 disposed on MLB 402. Communication slot 432 can in turn be in electrical contract with electrical traces disposed on a top or bottom surface of MLB 402. FIG. 4D also depicts how cowling 422 transmits a force through compressible layer 416 that helps maintain board connector 414 within communication slot 432 of MLB 402. Because compressible layer 416 is distributed evenly on either side of connector 430, no adverse lateral forces are transmitted when cowling 422 exerts a substantially even or at least symmetric force profile upon compressible layer 416. Consequently, any structural ribs exerting force on a compressible layer should be substantially centered with regards to connector 430 and communication slot 432.

Figure 4E:
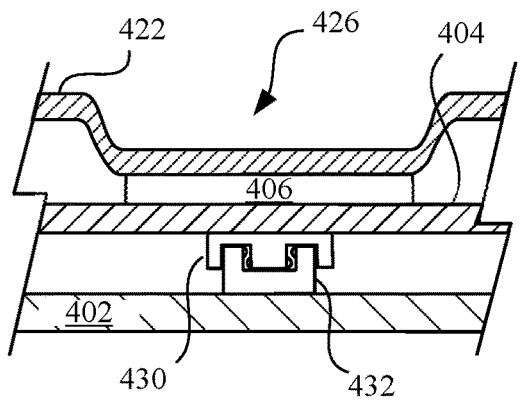
Figure 4F:
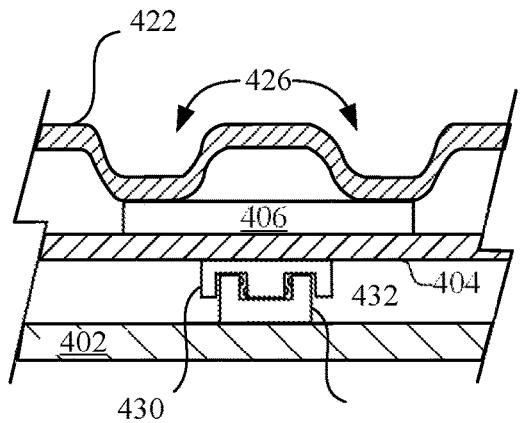
Figure 4G:
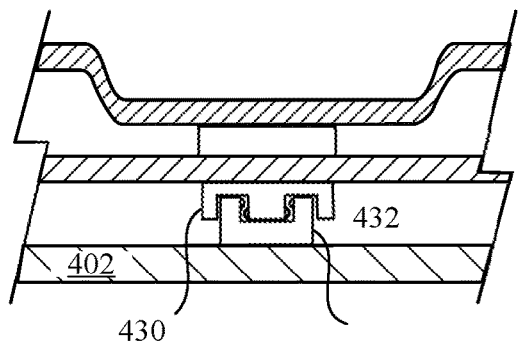
Figure 4H:
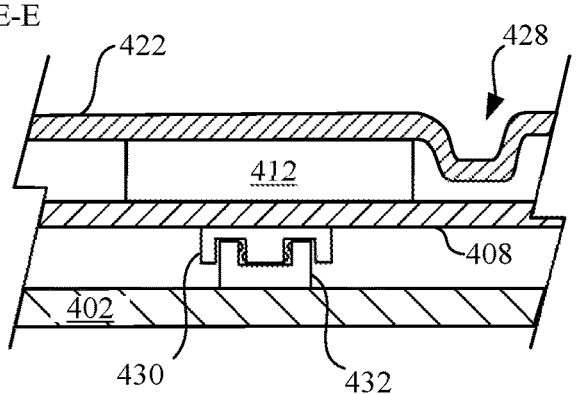

FIG. 4E depicts board-to-board connector 404 in accordance with section line D-D of FIG. 4B. Structural rib 426 is depicted having about the same width as compressible layer 406. This allows cowling 422 to place a substantially uniform amount of force upon compressible layer 406. FIG. 4F depicts an alternative configuration of board-to-board connector 404 in which two structural ribs contact compressible layer 406. Even though each one of structural ribs 426 is not centered with respect to compressible layer 406, they cooperate to exert a symmetric force upon connector 430 by way of compressible layer 406. In this way, as in the previous examples, no substantial lateral forces are exerted. FIG. 4G shows another similar configuration in which the depicted structural rib is substantially wider than the compressible layer; however, since the structural rib is centered over the compressible layer, this configuration would also work to secure connector 430. Finally, FIG. 4H shows a configuration in which connector 430 of board-to-board connector 408 is secured to communication slot 432 by a portion of cowling 422 that is adjacent to structural rib 428. Structural rib 428 is disposed near a peripheral portion of compressible layer 412 and is not directly above compressible layer 412, connector 430 and/or communication slot 732. In this way, structural rib 428 can surround a perimeter portion of compressible layer 412, connector 430 and/or communication slot 732 respectively. Furthermore, structural rib 428 can define in part a flat contact region of cowling 422 that is disposed directly over compressible layer 412. This configuration is also desirable as the lack of a structural rib allows a relatively thicker compressible layer 412 to be utilized and in some embodiments can be configured to account for a substantially larger deformation of cowling 422 than other thinner type compressible layers. When cowling 422 deforms, the aforementioned compressible layers are operable to maintain a force upon a corresponding board-to-board connector. In this way, a number of undesirable board-to-board connector disconnections can be substantially reduced.

Figure 4I:
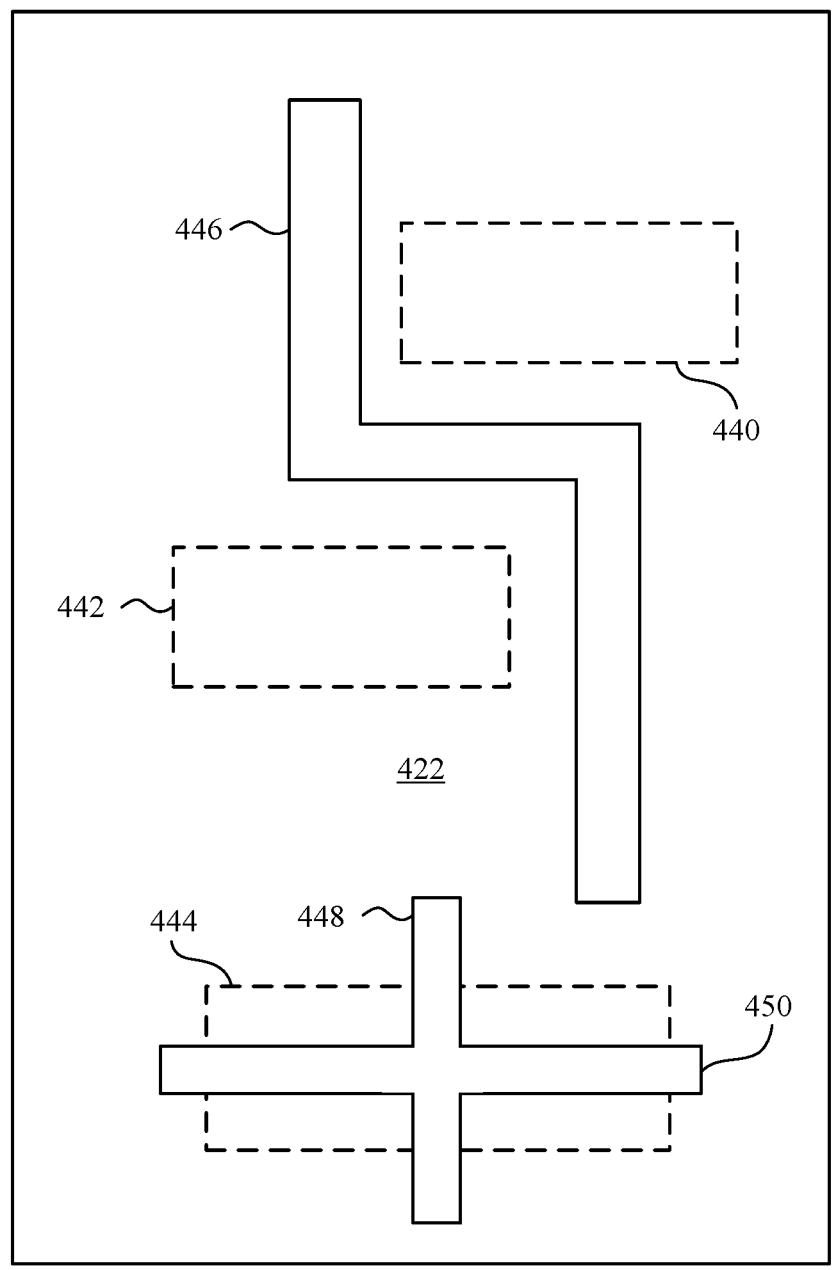
FIG. 4I shows a top view of a cowling disposed over several board-to-board connectors.

FIG. 4I shows a top view of an exemplary cowling 422 in accordance with some embodiments. Cowling 422 is disposed over board-to-board connectors 440/442/444. As previously discussed, structural ribs can be disposed in locations along cowling 422 in accordance with a heat map that can help to identify locations of cowling 422 that undergo higher levels of stress/deformation. In this embodiment, structural ribs 446/448/450 are disposed in various locations along cowling 422. Structural rib 446 "snakes" between board-to-board connectors 440 and 442 and is not disposed directly over any board-to-board connector. Structural ribs 448 and 450 are disposed directly over board-to-board connector 514 in a cross pattern. In this regard, a portion of structural rib 518 is disposed along a width of board-to-board connector 514 while a portion of structural rib 520 is disposed along a length of board-to-board connector 514.

Figure 5A:
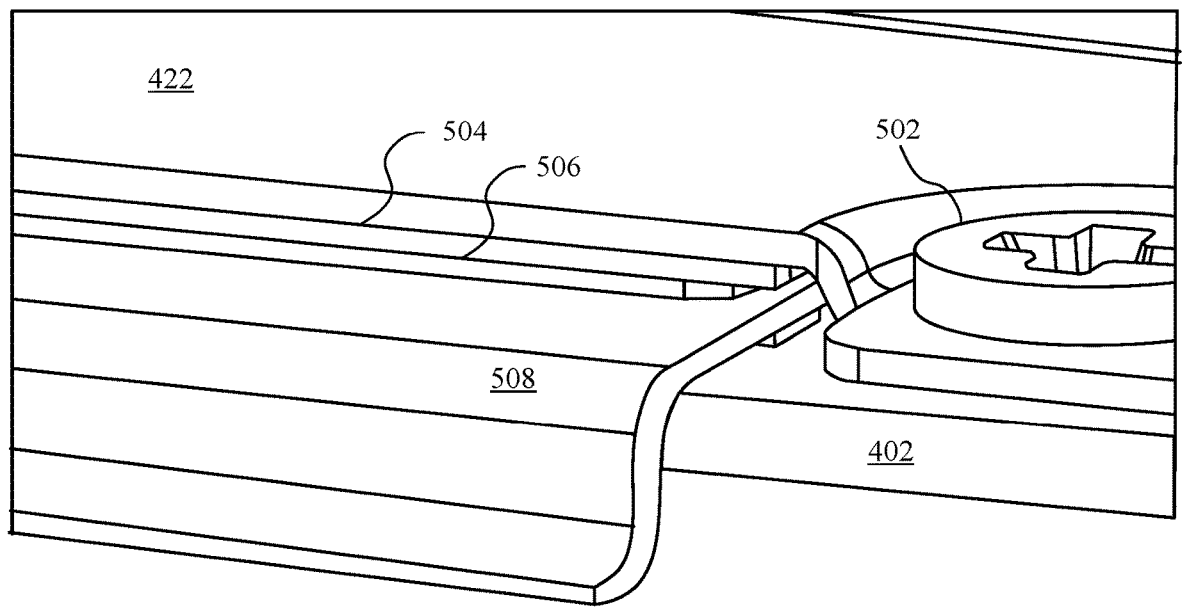
FIGS. 5A-5C show how a cowling can be reinforced by welding at least one plate to an inside surface of the cowling.
Figure 5B:
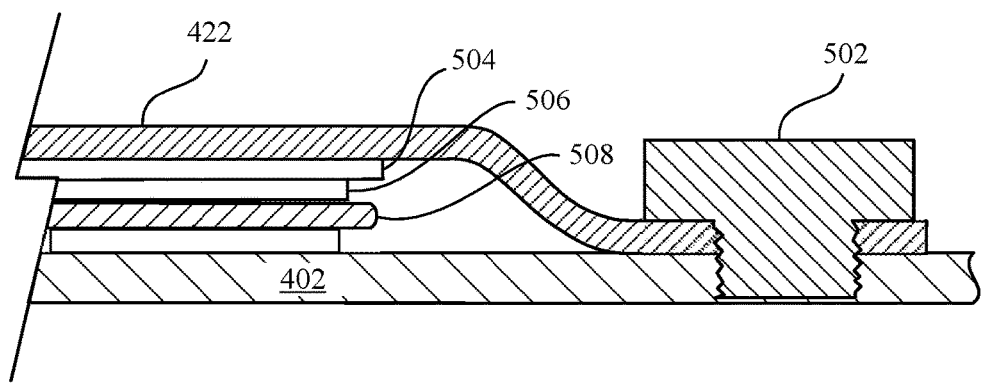
Figure 5C:
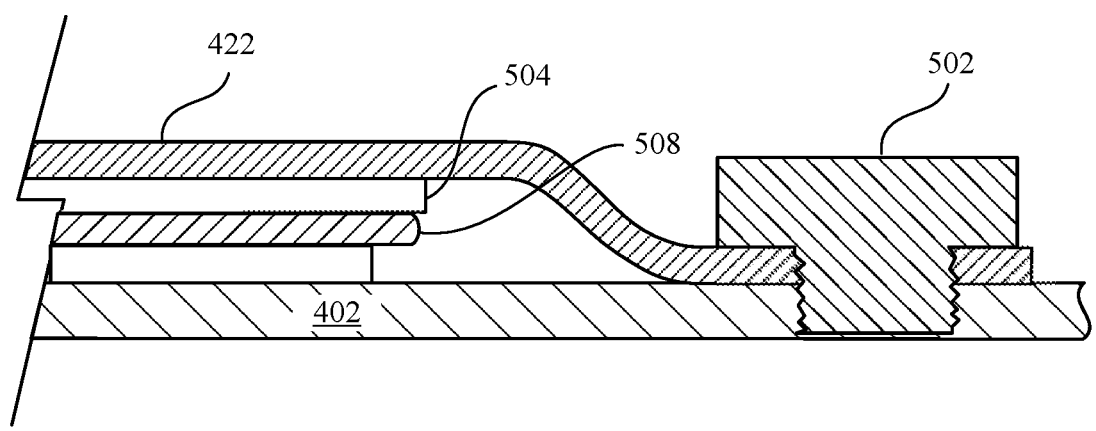

FIGS. 5A-5C show an alternative way of stiffening a cowling. This can be useful where a stamped rib does not provide a sufficient amount of rigidity to prevent dislodgement of an underlying board-to-board connector during a drop event. Furthermore, in some embodiments the cowling is only a 0.3 mm thick piece of steel sheet metal that often undergoes deformation when exposed to high forces or loading events. Simply increasing a thickness of the entire cowling may not be feasible as it can cause cowling 422 to interfere with other components within portable computing device 100. For example, as depicted in FIGS. 5A and 5B, a top portion of fastener 502 does not extend above a top surface of cowling 422; however if an overall thickness of cowling 422 were increased it would increase a thickness of the portion of cowling 422 disposed underneath fastener 502 thereby increasing an overall height dimension of fastener 502, which in some designs could cause fastener 502 to contend for space taken up by adjacent internal components disposed above fastener 502. FIGS. 5A and 5B also show how metal plates 504 and 506 can be welded with a bottom surface of cowling 422. In this way a thickness of cowling 422 can be selectively tuned to add material only where needed. In some cases metal plates 504 and 506 can be constructed from different material than the material that forms cowling 422. The selected materials can help tune a stiffness of cowling 422 in that particular location. The thickness of the plate or plates utilized can vary depending on a desired preload to be established between the welded plates and the underlying connector. The plates are operative to set a desired distance between a bottom surface of cowling 422 and board-to-board connector 508. FIG. 5C shows a cross-sectional side view in which only a single metal plate 504 is welded to the bottom surface of cowling 422. This can be a beneficial configuration when only a minor amount of strengthening is required and/or when a distance between cowling 422 and a top surface of the underlying connector is particularly small. Furthermore, in certain cases single metal plate 504 can be sized to have a thickness in accordance with the gap between cowling 422 and the underlying connector.

Figure 6A:
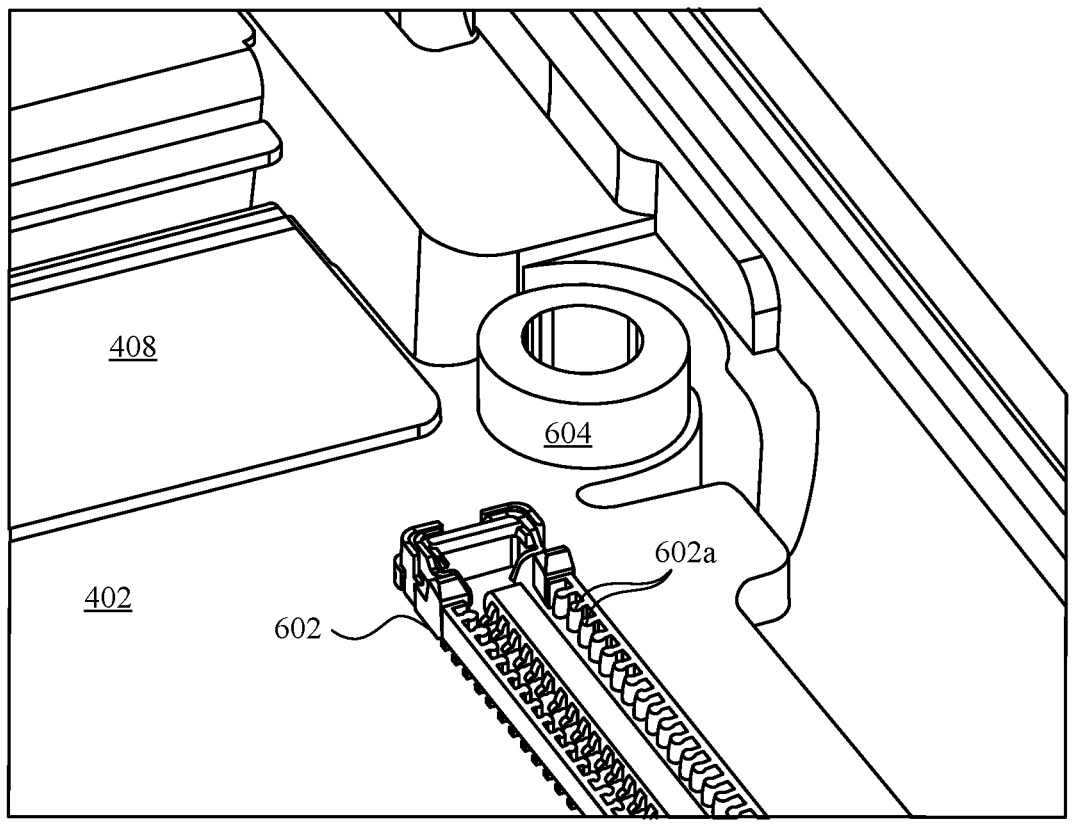
FIGS. 6A-6B show a number of embodiments relating to a standoff that both sets a mechanical distance between a cowling and a printed circuit board and electrically couples the cowling and the printed circuit board together.

FIG. 6A shows another interior perspective view along the lines of the depiction of FIG. 4A. The primary difference being that the board-to-board connector associated with compressible layer 420 has been removed and the corresponding communication slot 602 associated with that connector is exposed. Communication slot 602 can include a number of electrical contacts 602a that cooperate with a plug of a board-to-board connector to electrically couple MLB 402 to other components. The tight spacing of electrical contacts 602a make proper alignment of the board-to-board connector with the communication slot 602 particularly important. It should also be noted that standoff 604 can be conductively mounted to MLB 402 and that at least a portion of standoff 604 can be conductive so that electricity is able to flow from MLB 402 and through standoff 604, thereby allowing cowling 422 to be electrically coupled to MLB 402. In one embodiment, standoff 604 can be welded to MLB 402 prior to installation of MLB 402 within housing 104. Standoff 604 includes a top surface that can support a portion of cowling 422.

Figure 6B:
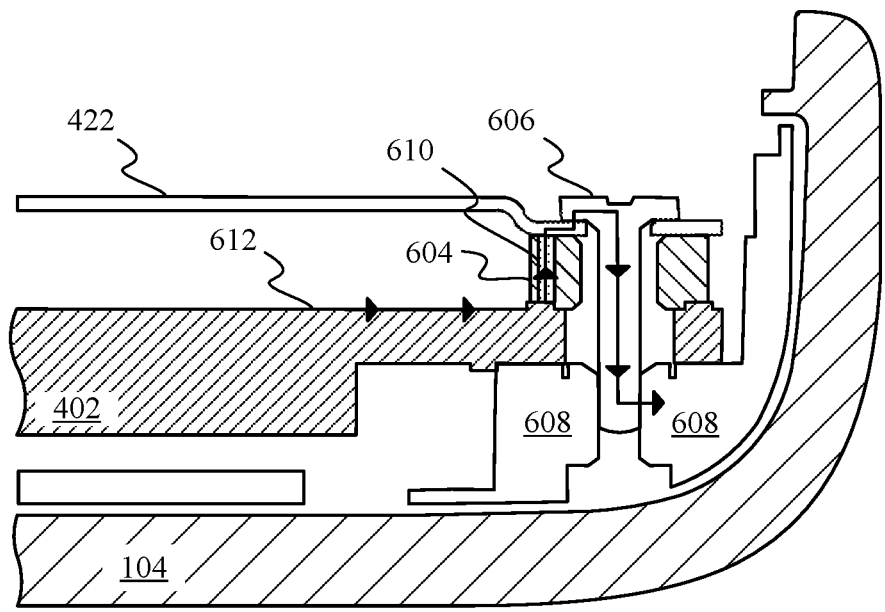

FIG. 6B is a cross-sectional side view showing how multiple components can be secured using a single fastener. Fastener 606 is driven through an opening in cowling 422 and an opening in standoff 604 to engage an opening in rigid frame member 608, thereby securing both cowling 422 and MLB 402 to rigid frame member 608 with a single fastener 606. Because MLB 402 is compressed in the stackup that includes MLB 402, standoff 604 and cowling 422, lateral motion of MLB 402 can be prevented at least by frictional forces present in the stackup. In addition to providing a mechanical linkage between the components in the stackup, fastener 606 can form a ground path between the aforementioned components and rigid frame member 608. An electrically conductive portion 610 of standoff 604 allows electricity to flow from MLB 402 to cowling 422, through fastener 606 and into rigid frame member 608. For example, electrically conductive pathway 612 shows how a component (not shown) disposed along a top surface of MLB 402 can be grounded through standoff 604 and fastener 606. It should be noted that in some embodiments, all of standoff 604 can be conductive and in other embodiments, standoff 604 can include a number of discrete conductive portions or pathways. Because the components can be efficiently grounded through standoff 604 and fastener 606, additional grounding springs or grounding components need not be utilized, thereby saving costs in components and assembly time.

FIGS. 7A-7F show various carrier tab embodiments for improving a manufacturing and assembly process utilized with portable computing device 100. During assembly, various small components can be secured within housing 104 with precision in order to create a durable, stable, and functional product. To ensure alignment and positioning accuracy during assembly, carrier tab 702 is set forth. Carrier tab 702 includes fastener opening 704, breakaway portion 706, breakaway holes 708, and solder openings 710. Carrier tab 702 can be formed from metal. For example, carrier tab 702 can be formed from steel, aluminum, copper, and/or any other material that can be bonded with a flexible circuit. In one specific embodiment, carrier tab 702 is formed from stainless steel that is nickel plated.

Figure 7C:
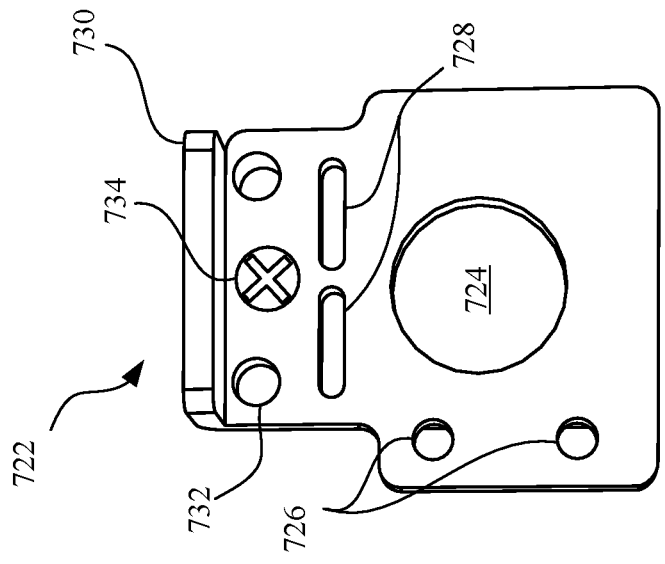
FIGS. 7A-7F show a number of carrier tab embodiments and how a carrier tab can be utilized to help align a flexible circuit with a retaining feature within a housing.
Figure 7B:
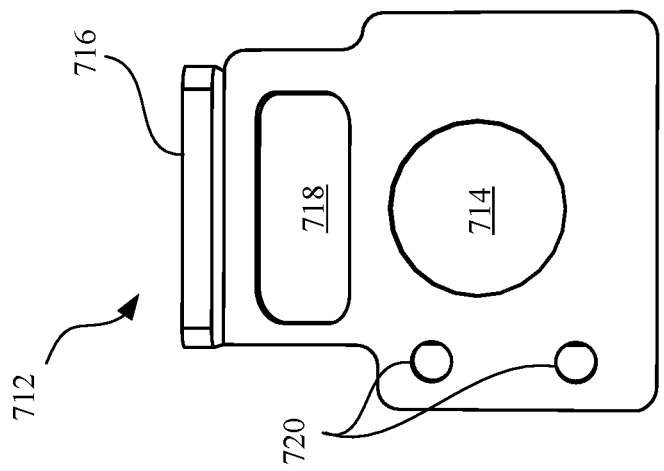
Figure 7A:
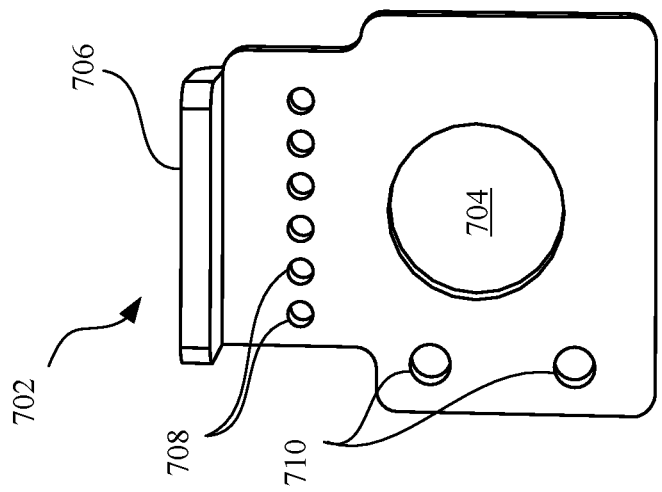

Carrier tab 702 of FIG. 7A can be used when attaching a flexible circuit within housing 104. In some embodiments, the flexible circuit can be associated with an antenna assembly. Carrier tab 702 can be bonded with the flexible circuit to establish an additional handle or means to grip and place the flexible circuit. For example, a flexible circuit can have a pad that can be soldered to carrier tab 702. Solder openings 710 can be utilized to assist in keeping the carrier tab 702 soldered to the pad by allowing excess solder disposed between the pad and carrier tab 702 to pass through solder openings 710 and bond to additional surfaces of carrier tab 702.

Breakaway portion 706 can act as a handle or grip means that is used to hold carrier tab 702 during an installation procedure. In some embodiments, carrier tab 702 can be maneuvered by a robotic arm that grips breakaway portion 706 during installation of carrier tab 702 and the flexible circuit within housing 104. In this regard, carrier tab 702 can be used to grip, move, and align the flexible circuit with respect to a portion of housing 104. The ability to align the flexible circuit is particularly useful when, for example, a mounting fastener needs to be directed through a number of components such as the flexible circuit, a fastening feature of housing 104, and fastener opening 704 of carrier tab 702. In one embodiment, a mounting fastener can be inserted through fastener opening 704 and an opening in the flexible circuit in order to secure the flexible circuit and carrier tab 702 against an interior surface of housing 104. Once the mounting fastener is securely fastened and the flexible circuit is sufficiently affixed within housing 104, breakaway portion 706 can be broken off from carrier tab 702 along breakaway holes 708 by repeatedly bending breakaway portion 706 back and forth. Breakaway holes 708 help to ensure breakaway tab separates from carrier tab 702 along the breakaway holes by weakening that portion of carrier tab 702. Carrier tab 702 can take up less space inside of housing 104 once the breakaway portion 706 is discarded. Thereafter, the flexible circuit, remaining portion of carrier tab 702, and mounting fastener reside in the computing device, securely fixed in place.

FIGS. 7B and 7C show alternative embodiments of a carrier tab in accordance with other embodiments. FIG. 7B shows carrier tab 712 that is similar to carrier tab 702 such that fastener opening 714, breakaway portion 716 and solder openings 720 are similar to corresponding features of carrier tab 702 respectively. Carrier tab 712 differs from carrier tab 702 in that it includes a single breakaway hole 718 instead of the perforated breakaway holes 708. Breakaway hole 718 is a single opening that is larger than any individual breakaway hole 708 of carrier tab 702. In this way, breakaway hole 718 provides a different type of perforation for breaking breakaway portion 716. Because more material is removed this configuration may be easier to break away; however the increased size of the opening may make a location of the breakaway point less certain. FIG. 7C shows carrier tab 722 that is similar to carrier tab 702. For example, fastener opening 724 and solder openings 726 are similar to corresponding features of carrier tab 702 respectively. FIG. 7C also shows carrier tab 722 having two elongated breakaway holes 728 for removing breakaway portion 730. Carrier tab 722 also includes openings 728 that can be used to align carrier tab 722 with housing 104. For example, pins of a robotic arm can cooperate with openings 732 to align carrier tab 722 within housing 104. In addition to openings 728, an alignment fiducial 734 can be disposed on the breakaway portion 730. Alignment fiducial 734 can also be an alignment feature that can be used in aligning carrier tab 722 with housing 104. For example, alignment fiducial 734 can be used in conjunction with a laser to help with proper alignment of carrier tab 722 with respect to housing 104.

Figure 7D:
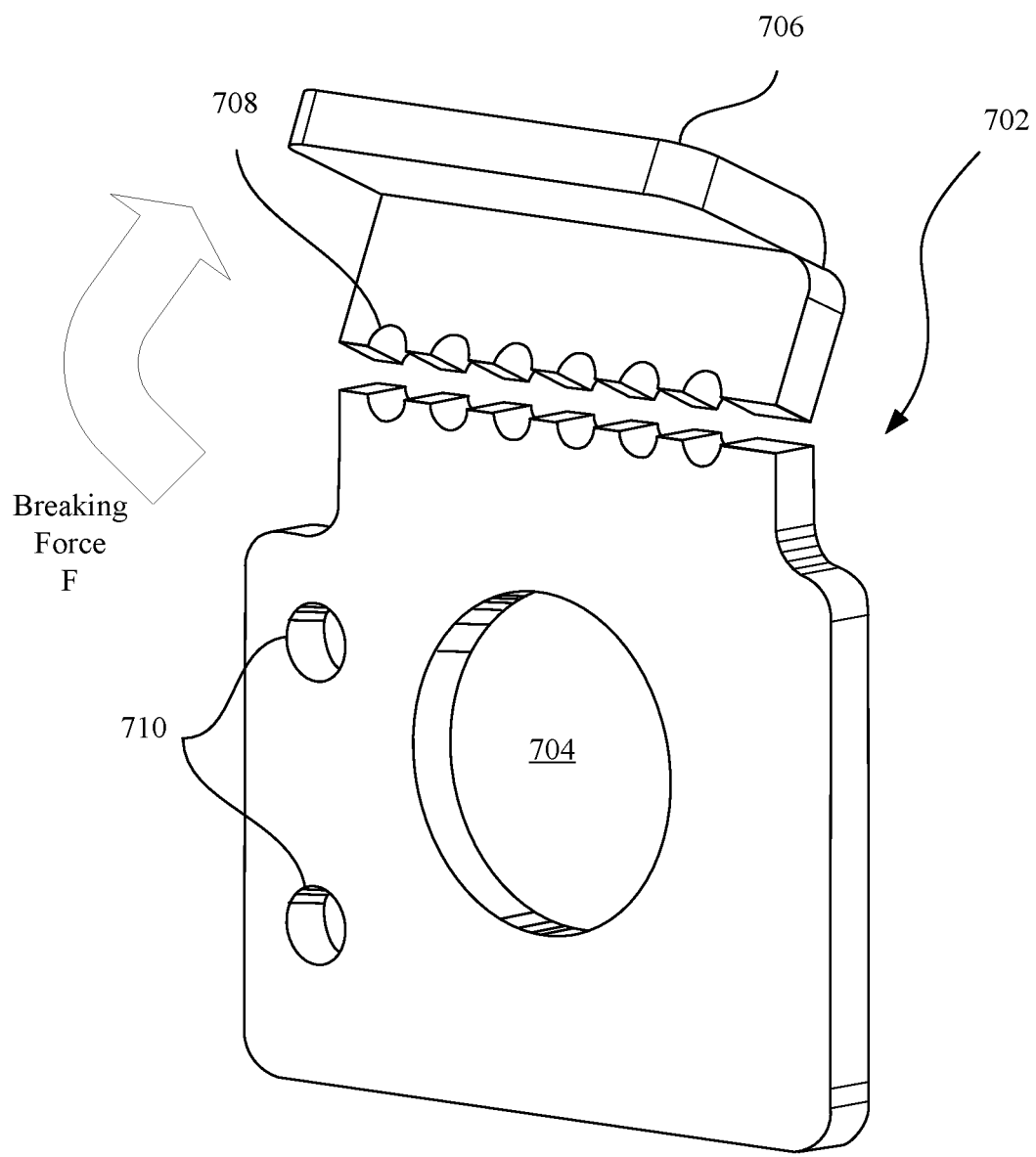
Figure 7E:
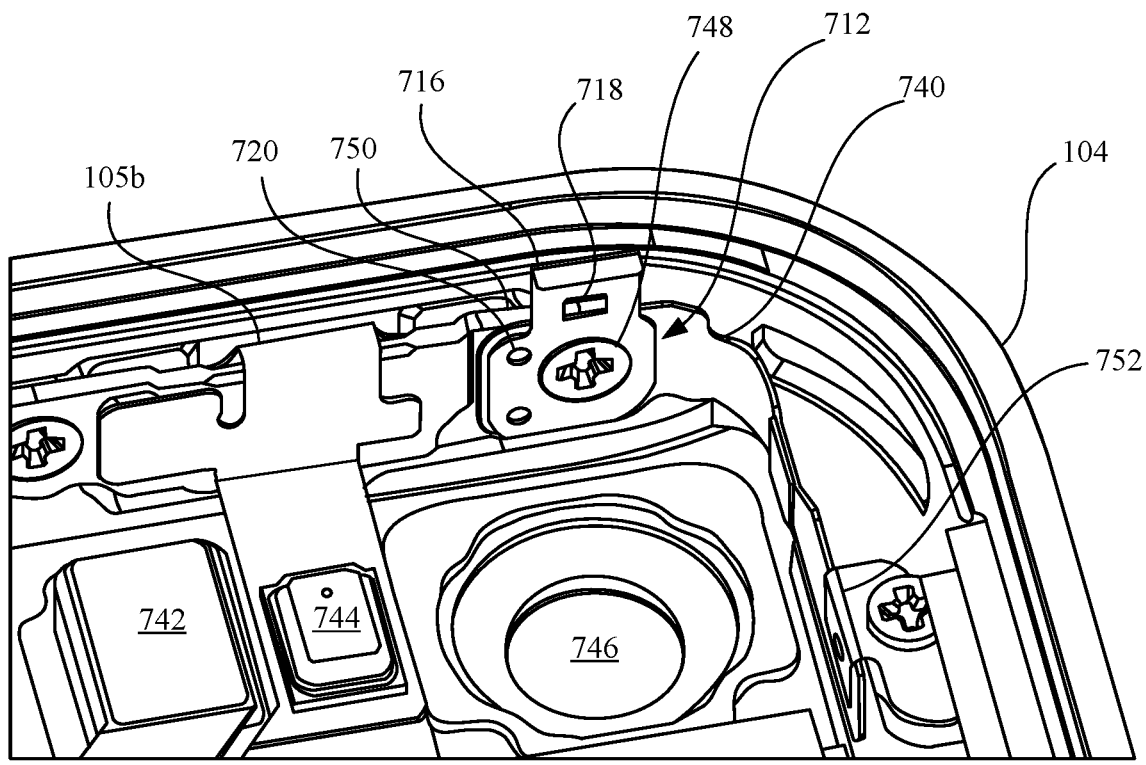
Figure 7F:
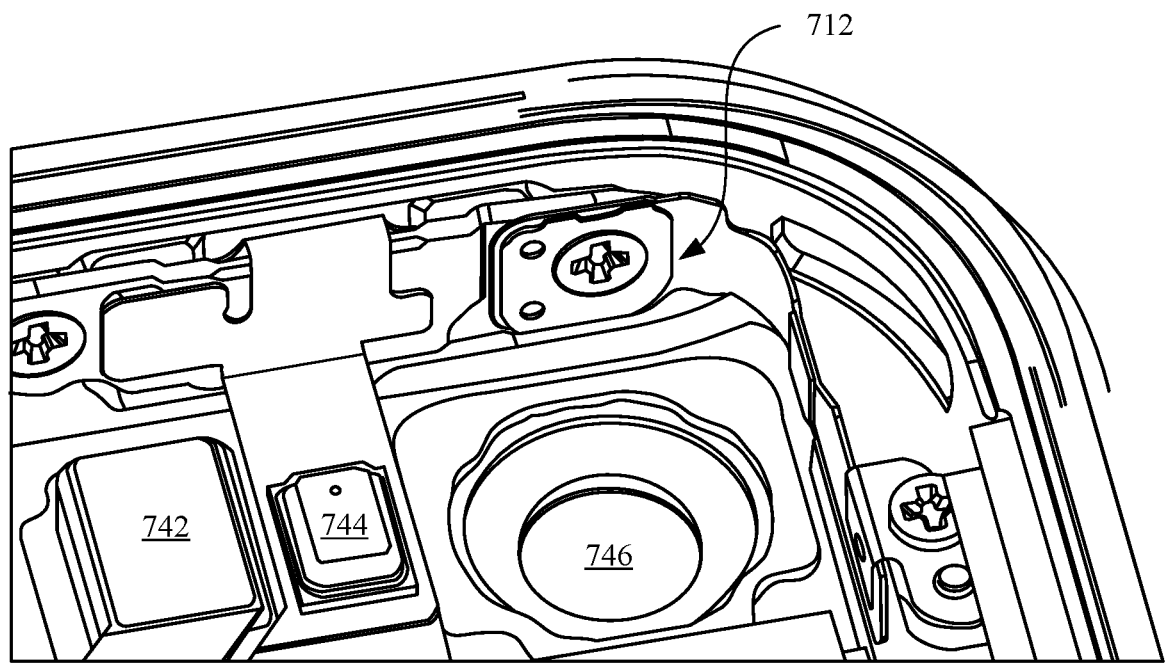

FIG. 7D shows a perspective view of carrier tab 702, and how a Breaking Force F can be used to separate breakaway portion 706 from carrier tab 702. In some instances, it may be necessary to bend breakaway portion 706 back and forth before breakaway portion 706 is dislodged from carrier tab 702. In other instances, it may be necessary to exert a twisting force on breakaway portion 706 before breakaway portion 706 is removed from carrier tab 702. FIGS. 7E-7F show how carrier tab 712 can be installed within portable computing device 100 and also how carrier tab 712 fits within portable computing device 100 after removing breakaway portion 706.

FIG. 7E shows carrier tab 712 disposed within an interior portion of housing 104 in accordance with some embodiments. Carrier tab 712 is soldered to flexible circuit 740. Flexible circuit 740 can be associated with components disposed within the housing 104. For example, flexible circuit 740 can communicate signals to LED 742, microphone 744, and/or a camera (not shown) associated with opening. A fastener 748 fastens carrier tab 712 and flexible circuit 740 to a portion of interior frame member 750 of portable computing device 100. In this embodiment, fastener 748 is a screw and interior frame member 750 is a steel reinforcement frame. Interior frame member 750 can also be used to support a portion of button assembly 106b. In this regard, flexible circuit 740 can also be used to communicate signals associated with button assembly 105b. Another portion of flexible circuit 740 can also be secured within housing 104. For example, one end of flexible circuit 740 can be fastened to mounting surface 752. FIG. 7F shows how, subsequent to fastening carrier tab 712 and flexible circuit 740 to interior frame member 750, breakaway portion 716 can be removed from carrier tab 712. As previously discussed, removing breakaway portion 716 can provide more interior space within housing 104 for other components.

Figure 8A:
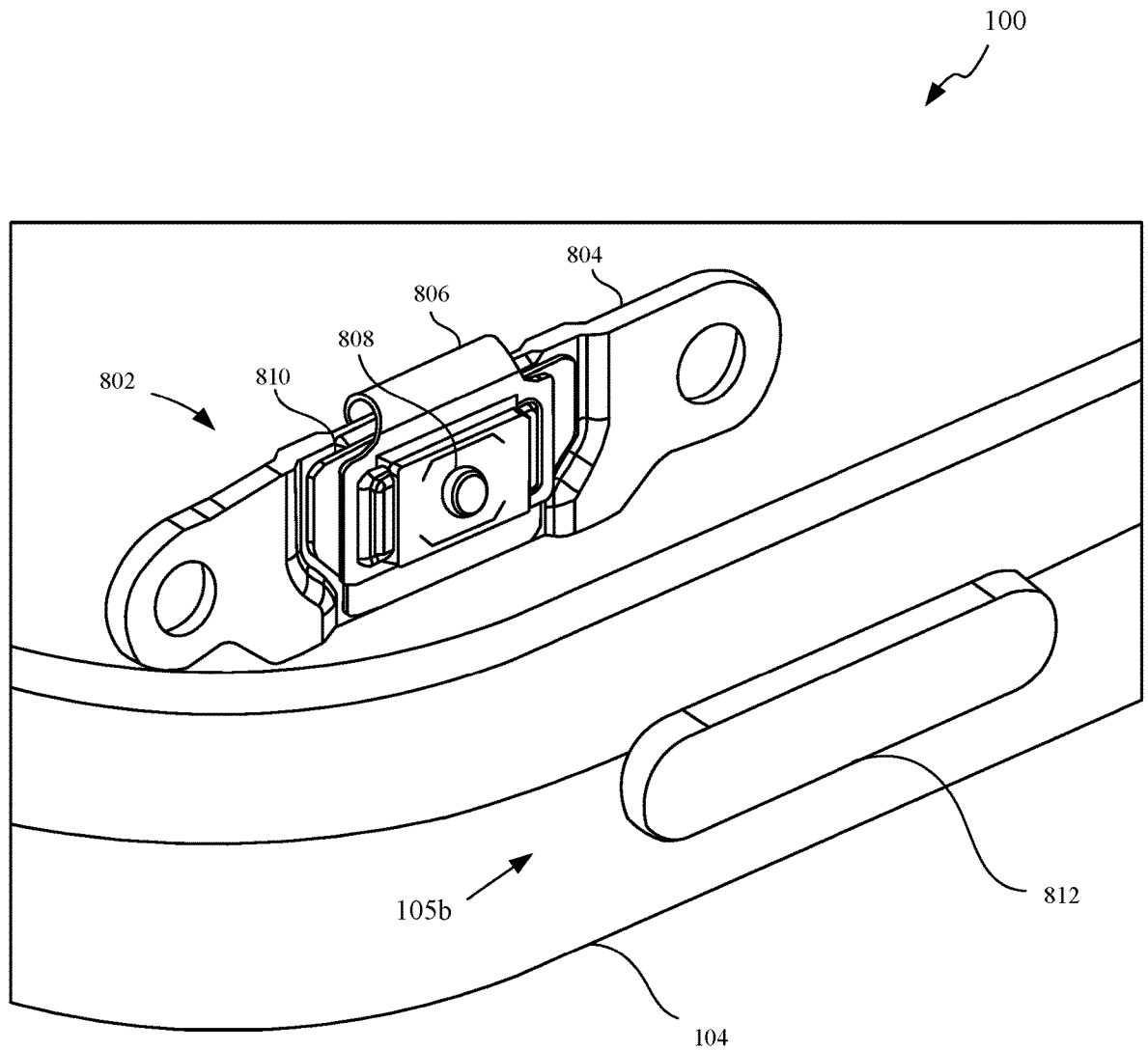
FIGS. 8A-8C show how a button switch assembly can be positioned within a housing.
Figure 8B:
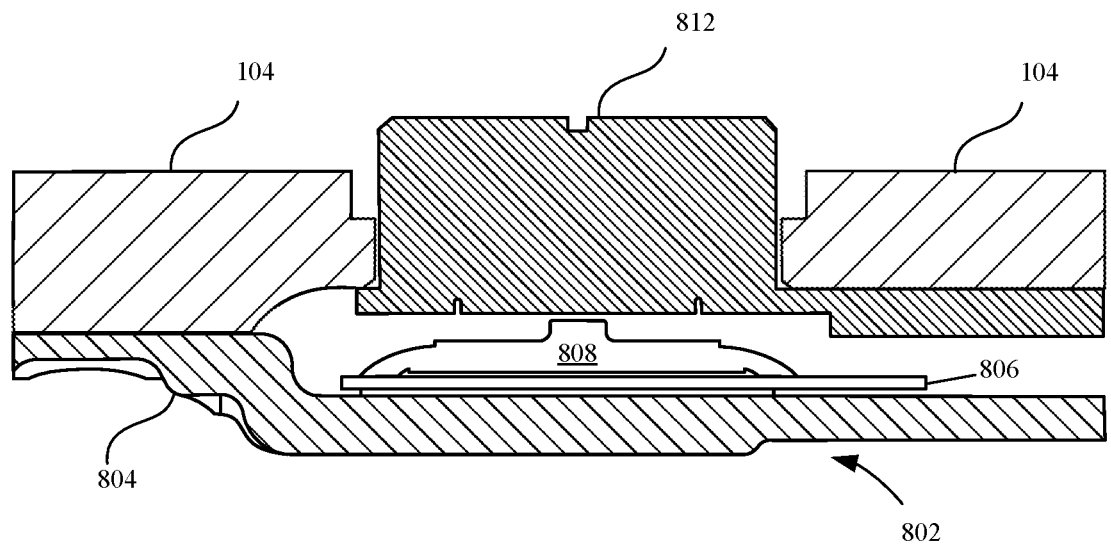
Figure 8C:
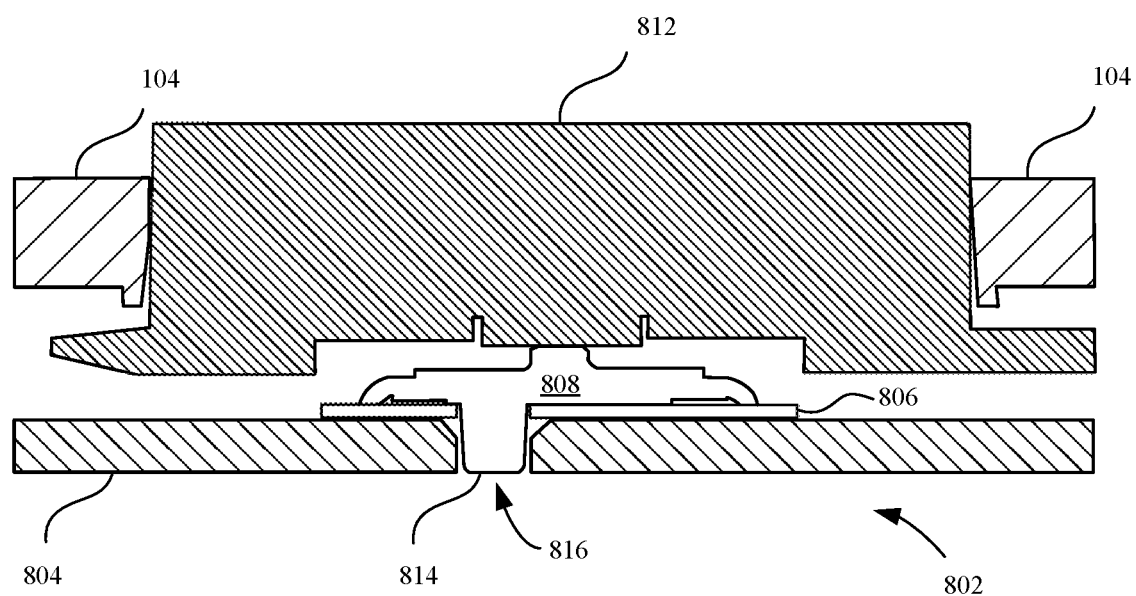

FIGS. 8A-8C show an exemplary button assembly 105b in accordance with some embodiments. FIG. 8A shows a perspective view of internal and external portions of portable computing device 100. Disposed within an internal portion of portable computing device 100 is a securing system 802. Securing system 802 can include a bracket 804, a flexible circuit 806, a switch 808, and a stiffener 810. Securing system 802 can be used to secure switch 808 with housing 104 or other mounting surface such that switch 808 cooperates with button 812 to provide a switch button functionality for portable computing device 100.

Flexible circuit 806 can be a substantially planar substrate configured to support and electrically couple various electrical components. At least one side of flexible circuit 806 can be configured to be coupled with switch 808. Switch 808 can be mounted on one side of flexible circuit 806 while stiffener 810 is coupled to an opposing side of flexible circuit 806. In some embodiments, stiffener 810 is coupled to flexible circuit 806 with a heat-activated adhesive. Flexible circuit 806 can electrically couple switch 808 to a processor (not shown) of portable computing device 100.

Stiffener 810 can be formed of a conducting material such as stainless steel (SUS). For example, stiffener 810 can be formed from SUS Grade 301. SUS is generally considered to be weldable by common fusion and resistance techniques. Accordingly, stiffener 810 can be welded to bracket 804. In this regard, the stiffener 810 can be used as an intermediate coupling device for securing flexible circuit 806 (and consequently switch 808) to bracket 804. Bracket 804 can include one or more alignment features or openings that can be used to fasten bracket 804 to housing 104 or other mounting surface.

FIG. 8B shows a partial cross-sectional side view of a securing system, a button and a housing enclosure in accordance with one embodiment. Securing system 802 can be secured to the housing 104 or other mounting surface so that switch 808 is aligned with button 812. Flexible circuit 806 can be adhesively coupled or welded with (via stiffener 810) to bracket 804. Unfortunately, in certain embodiments, small components may not have sufficient surface area to maintain a robust coupling between a mounting surface, such as a bracket, and a flexible circuit. This can be of particular concern when the coupling is frequently subjected to normal and/or force components as a part of normal operation of a device. For example, flexible circuit 806 can undergo significant shearing force during actuation of switch 808 (by way of button 812) and can cause the adhesive integrity between flexible circuit 806 and bracket 804 to be compromised. Consequently, a compromised coupling between flexible circuit 806 and bracket 804 can adversely affect the alignment between button 812 and switch 808. Poor alignment between the button 812 and switch 808 can cause a poor user experience when a user actuates button 812.

FIG. 8C shows a partial cross-sectional side view of a securing system, a button and a housing enclosure in accordance with another embodiment. In this embodiment, switch 808 can include an alignment feature 814 that can be sized and dimensioned to work in conjunction with an opening 816 of bracket 804. In some aspects of the embodiment, alignment feature 814 is an integrally formed portion of switch 808. For example, alignment feature 814 can take the form of a post or protrusion that is integrally formed with switch 808. Alignment feature 814 can cooperate with opening 816 to resist undesirable application of shearing forces upon switch 808, particularly after prolonged use of switch 808. In this way an adhesive coupling can be substantially protected from an application of shearing forces by the interaction between alignment feature 814 and opening 816. Furthermore, alignment feature 814 and opening 816 can also assist in aligning switch 808 with button 812 during an assembly process.

Figure 9A:
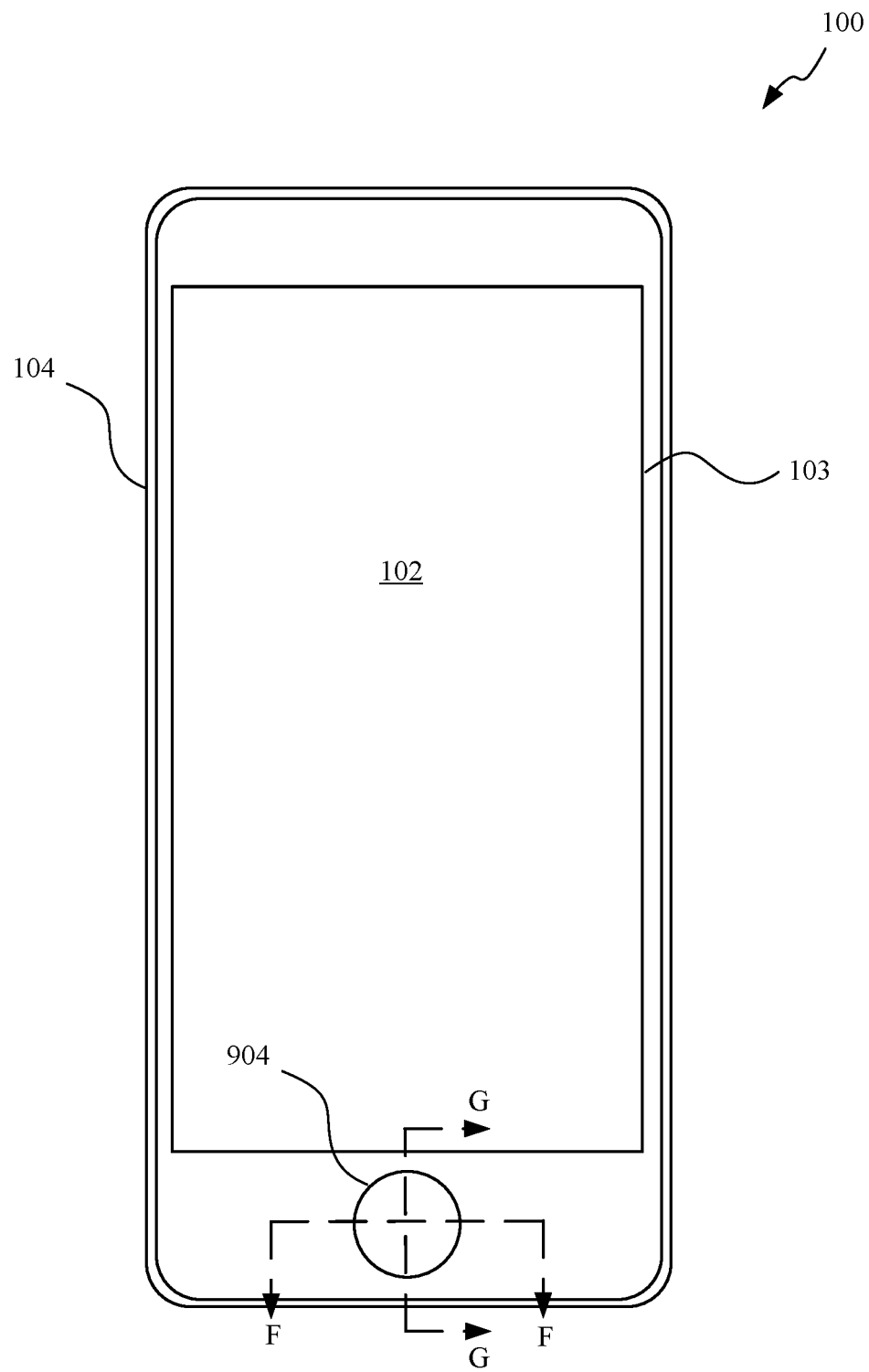
FIGS. 9A-9C show a flange for providing a particular tactile feedback for a button of the portable computing device.

FIG. 9A shows a front view of an exemplary portable computing device 100 having a display assembly 902 and a button 904. Display assembly 902 can be covered by protective cover 102 that provides a surface upon which a user can enter touch inputs in accordance with a user interface displayed by display assembly 902. In some embodiments, protective cover 102 can be formed from hardened glass while in other embodiments it can be formed of other transparent materials such as, for example, plastic. Button 904 provides portable computing device 100 with a user interface. In some embodiments, button 904 can be utilized to activate portable computing device 100. Button 904 can be formed from plastic. In some cases, a plastic button 904 can be hard coated in order to provide a protective coat. When actuated by a user, button 904 can provide a firm and stable tactile feel. The tactile feel can be created by interaction of button 904 with a flange and a mechanical switch disposed beneath button 904.

Figure 9B:
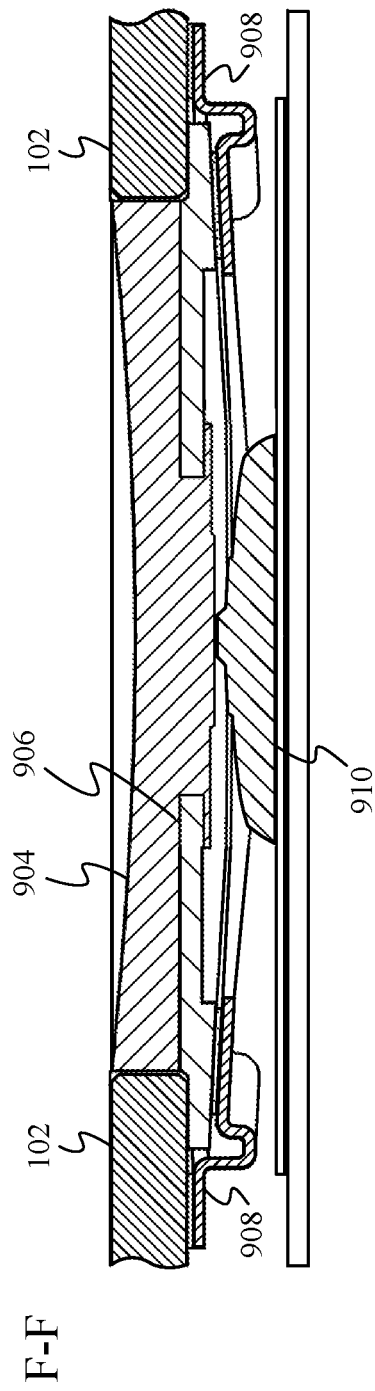
Figure 9C:
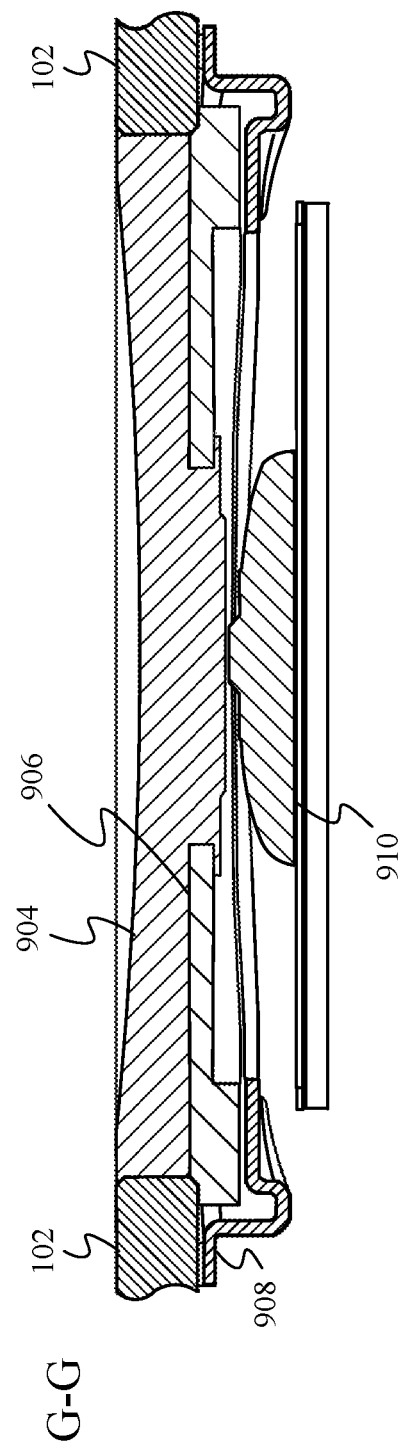

FIGS. 9B and 9C show cross-sectional side views of button 904 in accordance with section line F-F and line G-G respectively. Button 904 is depicted as being disposed within an opening in protective cover 102. In other embodiments, button 904 can be disposed within other enclosure components of portable computing device 100. For example, the button 904 can be disposed within an opening defined by a sidewall of housing 104. Button 904 includes an external surface having a concave shape such that a center of button 904 is recessed further into the opening of portable computing device 100 with respect to a periphery of button 904. Beneath button 904 is flange 906 that is operable to at least partially seal an interface between protective cover 102 and button 904 and also to provide resistance to actuation of button 904. Flange 906 can be formed from a flexible material such as polycarbonate. Flange 906 is supported against button 904 by internal bracket 908 that extends around a periphery of flange 906 and is coupled to both flange 906 and a bottom surface of protective cover 102. The coupling can be accomplished in a number of ways including by use of an adhesive. Internal bracket 908 is also contoured so that it supports the varying shape of flange 906. Movement of button 904 is controlled in part by flange 906 as it actuates switch 910. In some embodiments, switch 910 can be a dome switch that also contributes to an overall response provided during actuation of button 904.

Flange 906 can have a varying cross-sectional thickness so that flange 906 is substantially thicker along a periphery with respect to a center of flange 906. In this configuration, flange 906 can allow the center of button 904 to be recessed further than a periphery of button 904 thereby providing a stable tactile response when button 904 is actuated. Accordingly, switch 910 can be positioned under the center of button 904 to increase the likelihood that switch 910 will be actuated when button 904 is pressed. By selectively thickening flange 906, a structural integrity of flange 906 can be enhanced so that flange 906 is less susceptible to cracking. Cracking can occur due to wear from multiple actuations of button 904. Furthermore, this configuration can also assist in preventing button 904 from protruding from the opening in protective cover 102. In this regard, flange 906 positions button 904 at a desired height with respect to protective cover 102.

It should be noted that flange 906 can also be selectively thickened to leave space for components that are disposed near flange 906. For example, flange 906 can be thinner where components below flange 906 are too tall to accommodate an increased thickness. As depicted in FIGS. 9A and 9B, flange 906 can have a thicker periphery in cross-section G-G than a periphery in cross-section F-F. The periphery thickness can be varied in this way to accommodate components adjacent to peripheral portions of flange 906 (e.g., components associated with display assembly 902).

Figure 10A:
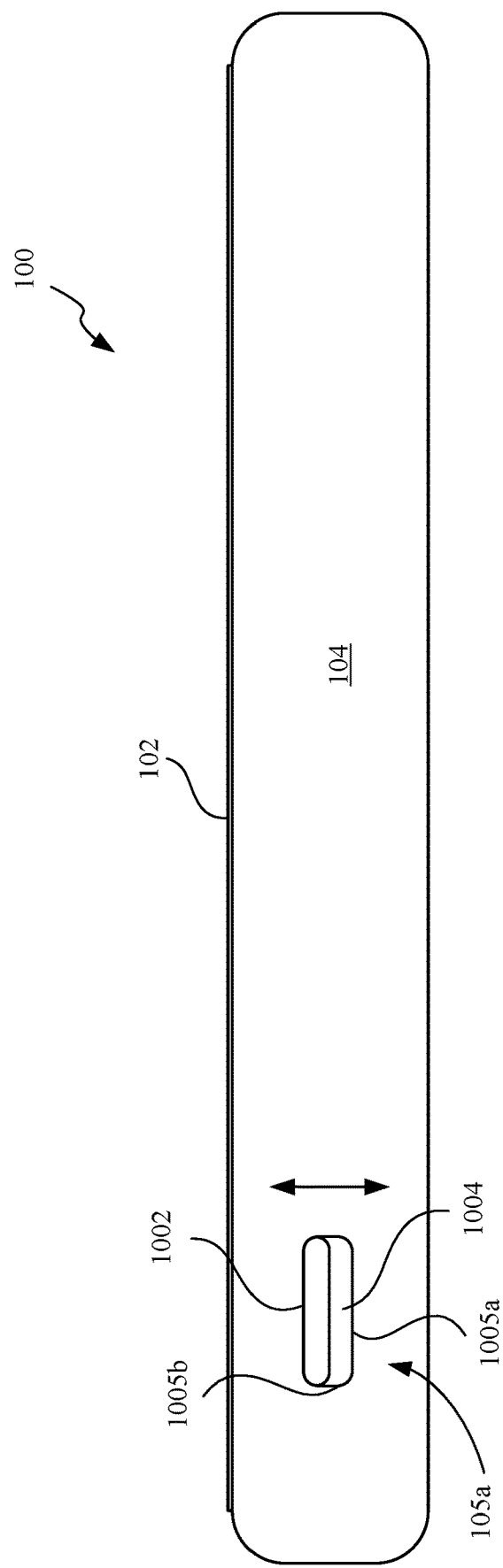
FIG. 10A shows a button assembly disposed on a side of the portable computing device.

FIG. 10A shows a side view of portable computing device 100. Button assembly 105a is depicted as being disposed along a sidewall of portable computing device 100. Button assembly 105a can include a slide switch 1002 that is installed within an opening 1004 disposed on a sidewall of housing 104. A portion of slide switch 1002 protrudes through opening 1004. Slide switch 1002 can be used to provide portable computing device 100 with user interface functionality. For example, slide switch 1002 can be used as toggle ON/OFF switch. To actuate slide switch 1002, a user can exert a force on the portion of slide switch 1002 that extends through opening 1004, thereby causing slide switch 1002 to move from a first position to a second position within opening 1004 as indicated by the arrow. The opening 1004 can be characterized as having a major dimension and a minor dimension. In one example, the major dimension can refer to a length of the opening 1004 and the minor dimension can refer to a width of the opening 1004. In some examples, the major dimension is greater than the minor dimension. As shown, the opening 1004 includes a first dimension 1005a that corresponds to the major dimension and a second dimension 1005*b* that corresponds to the minor dimension. The first dimension 1005*a* can be larger than the second dimension 1005*b*.

Figure 10B:
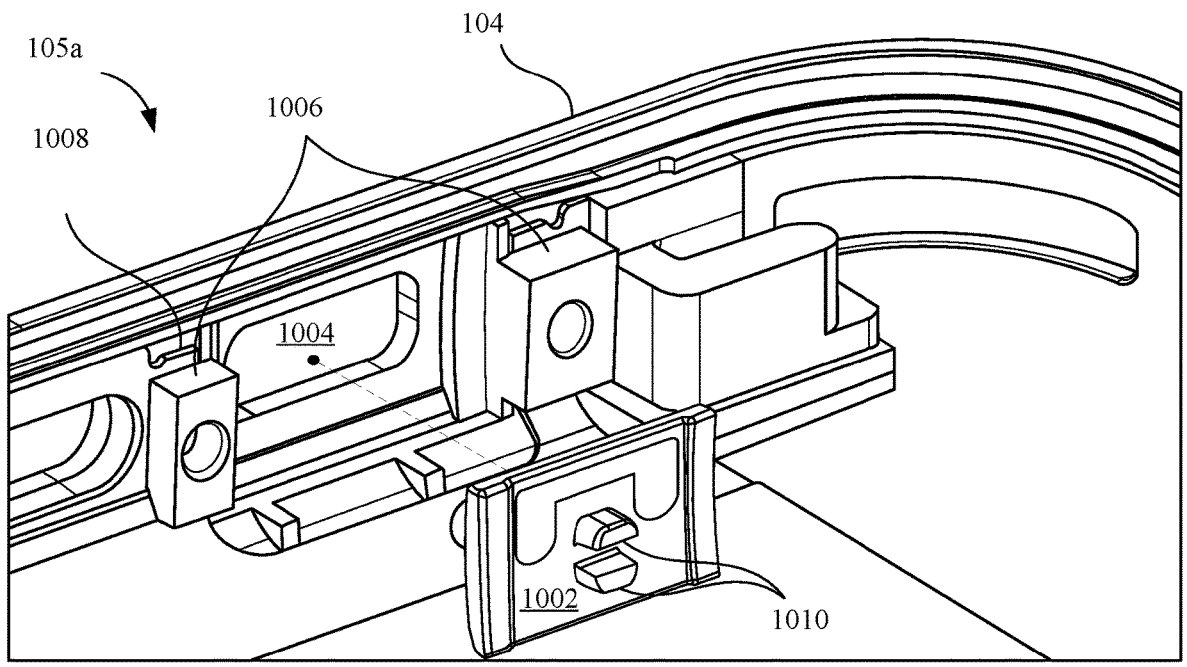
FIGS. 10B-10C show how a set of rails for a slider switch can be arranged to provide a precise track along which the slider switch can be actuated.
Figure 10C:
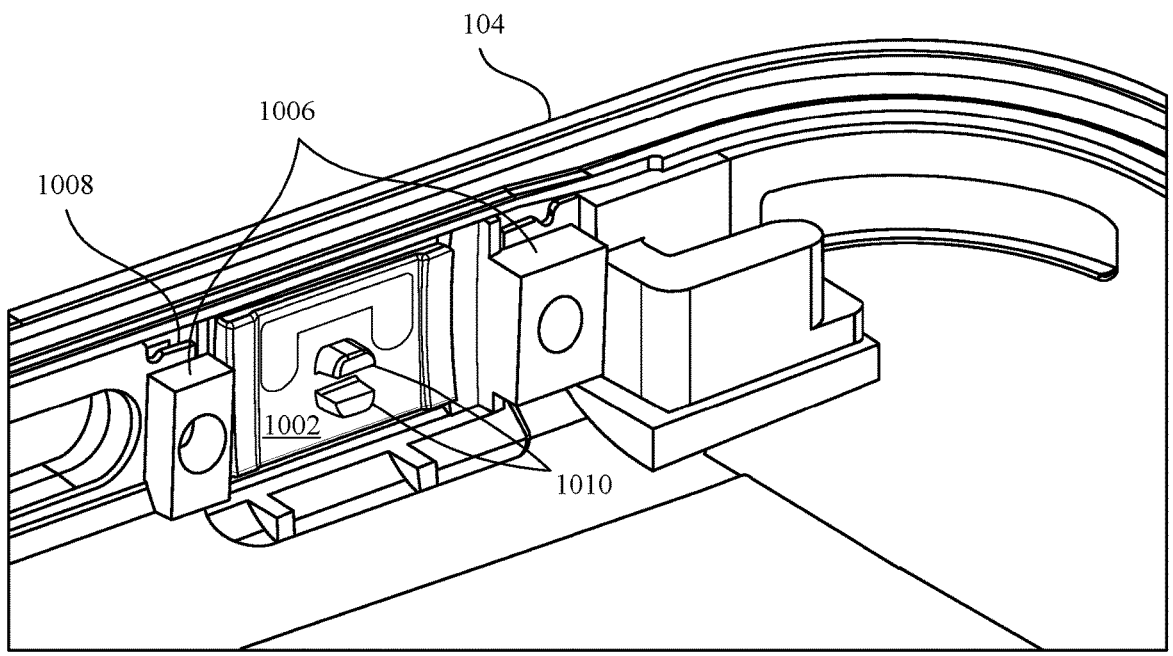

FIGS. 10B-C show partial views of an internal portion of housing 104. Movement of slide switch 1002 is constrained by rails 1006, which define a vertical path along which slide switch 1002 can travel. Rails 1006 are coupled to an internal frame member 1008. Internal frame member 1008 can be disposed within housing 104. In some embodiments, internal frame member 1008 can be coupled to housing 104. For example, internal frame member 1008 can be coupled to an interior surface of housing 104 using an adhesive, friction fit, fastening system, molding techniques or combination thereof.

In one embodiment, rails 1006 can be coupled to internal frame member 1008 by welding them together. For example, rail 1006 and internal frame member 1008 can be laser welded together. In another embodiment, rails 1006 can be coupled to internal frame member 1008 by brazing. Rails 1006 can be made from metal such as stainless steel or any other material that can be welded to internal frame member 1008. Internal frame member 1008 can also be made from metal and is configured to be substantially rigid. Because rails 1006 are coupled with a substantially rigid internal frame member 1008, a distance between rails 1006 stays substantially constant and is not subject to the type of deformation experienced by a component coupled directly to housing 104. This stability can provide a user with a consistent tactical response when the user actuates slide switch 1002.

Furthermore, this configuration is preferred over one in which rails 1006 are integrally formed along an inside surface of housing 104 because formation of the rails within housing 104 can cause cosmetic problems along an outside surface of housing 104. For example, the formation of rails using an injection molding operation typically results in blemishes on the outside surface of housing 104. Slide switch 1002 also includes protrusions 1010 facing away from opening 1004. Protrusions 1010 allow slide switch 1002 to engage an electrical switch (not shown) disposed adjacent to slide switch 1002. In this way, when a user maneuvers slide switch 1002 between positions, portable computing device 100 can execute an operation in response to a signal provided by the electrical switch. For example, slide switch 1002 can provide ringer control functionality for portable computing device 100.

Additional modifications to the assembly process can be provided in order to establish additional space within the computing device. During both assembly and operation, the computing device should provide room internally for various components to function properly. Functionality can be disrupted when components interfere with the operation of other neighboring components inside the computing device.

Figure 11A:
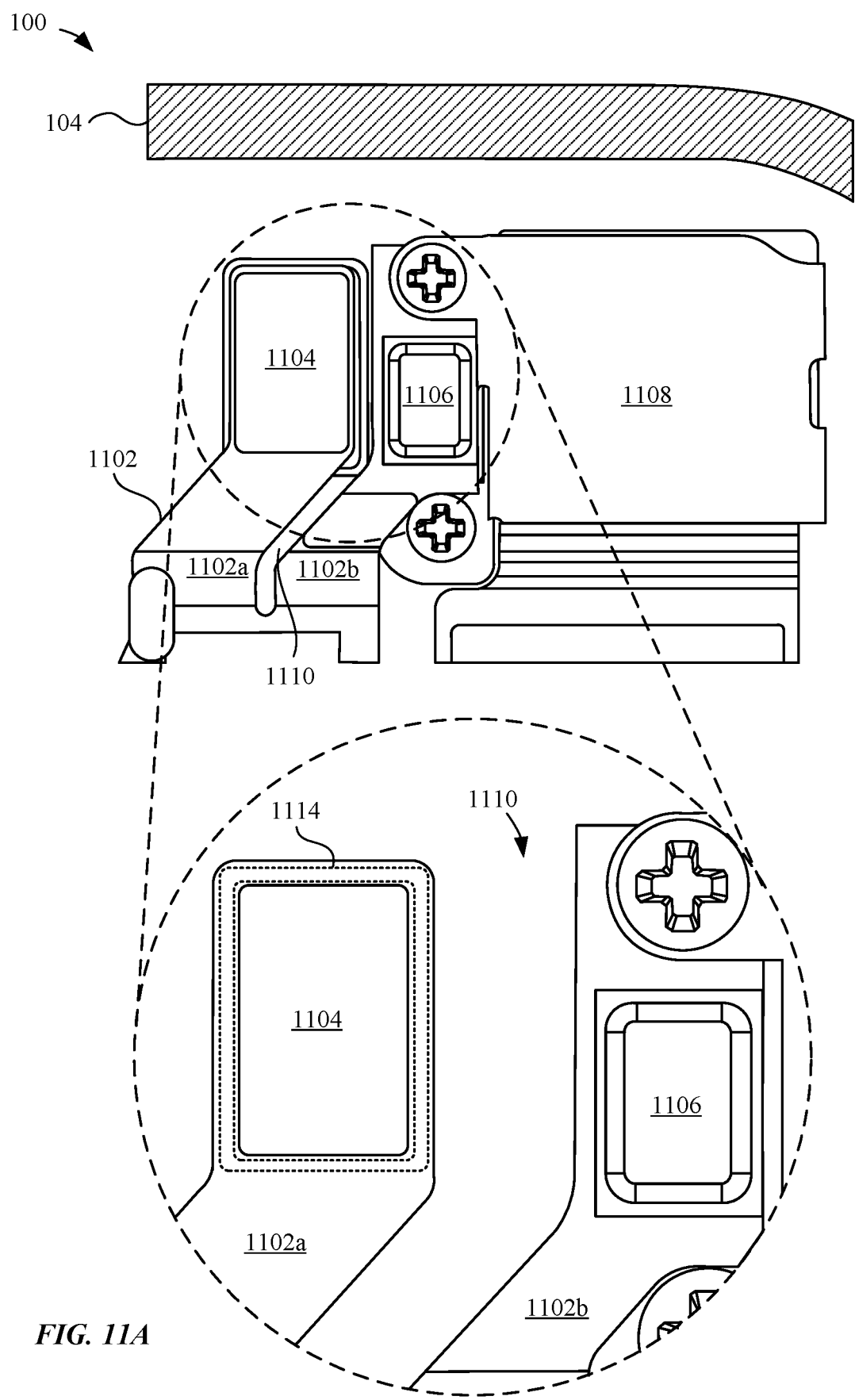
FIG. 11A shows an internal arrangement of components and connectors associated with a camera assembly.

FIG. 11A shows an internal view of an interior portion of portable computing device 100. Portable computing device 100 can include a flexible circuit 1102, a light emitting diode (LED) 1104, a microphone 1106 and a camera 1108. Flexible circuit 1102 can include a first tail 1102*a* and a second tail 1102*b*. LED 1104 can be coupled near one end of first tail 1102*a* and microphone 1106 can be coupled near one end of second tail 1102*b*. As described further below, first tail 1102*a* and second tail 1102*b* can be created by cutting flexible circuit 1102; the cut can result in gap 1100. Cutting flexible circuit 1102 to define one or more tails, such as first tail 1102*a* and second tail 1102*b*, can provide flexible circuit 1102 with an increased flexibility in maneuvering and positioning. In this regard, first tail 1102*a* and second tail 1102*b* can extend to different positions within the interior portion of portable computing device 100 without placing undo stress on flexible circuit 1102. This is particularly advantageous when first tail 1102*a* and second tail 1102*b* extend to different planes.

LED 1104 can be configured to provide portable computing device 100 with an illumination device. Although embodiments herein describe an LED configured to provide a camera flash, this embodiment is not limiting and it should be understood that an LED can also be used in an electronic device for a variety of applications. For example, an LED can be used to provide a visual indication, flashlight functionality and/or any other application where a light source is needed.

Figure 11B:
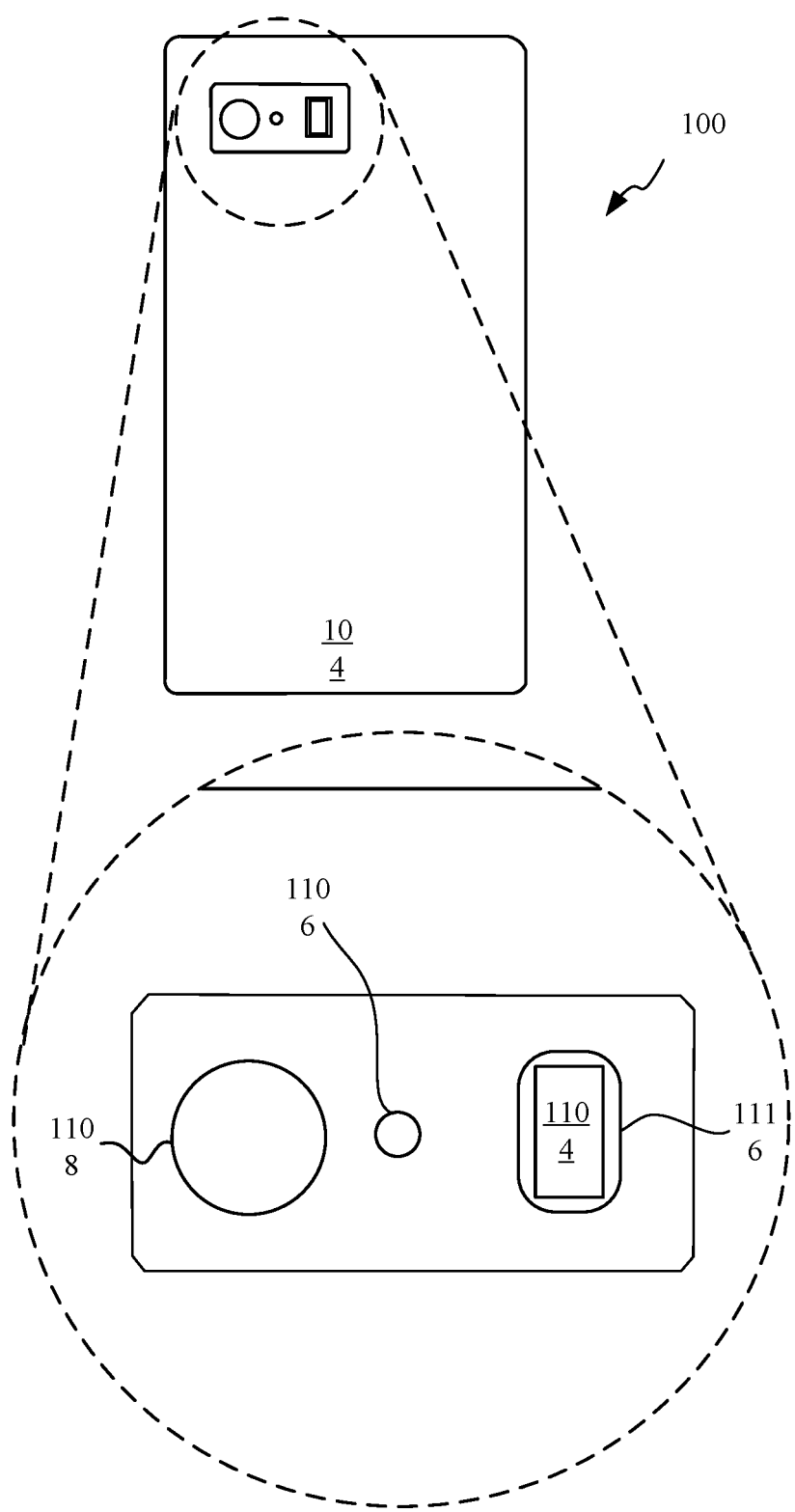
FIG. 11B shows an external view of a camera assembly of the portable computing device.

FIG. 11B shows a back view of portable computing device 100 in accordance with some embodiments. Housing 104 of portable computing device 100 encloses LED 1104, microphone 1106, and camera 1108 within the portable computing device 100. Housing 104 can define an opening 1116 for exposing LED 1104 to an outside environment. In this regard, light emitted from LED 1104 can be directed away from portable computing device 100. In use, LED 1104 can emit a flash of light substantially concurrent with actuation of camera 1108 (i.e., when camera 1108 takes a picture). In some embodiments, LED 1104 is orientated such that the flash of light is emitted in substantially the same direction as the direction camera 1108. Accordingly, LED 1104 can be disposed near camera 1108 within portable computing device 100 as shown in FIGS. 11A and 11B.

In some cases, light emitted from LED 1104 can spread to undesirable locations. For example, light from a camera flash can leak within the interior of portable computing device 100 and spread to other portions of portable computing device 100. The undesirable light leakage can adversely affect other operations or components of portable computing device 100. In some embodiments, the minimization of light leakage can be realized by surrounding a portion of LED 1104 with a structure such as a seal, adhesive, or shim. The structure can be a fixture or other component coupled to an inner surface of housing 104 or to an inner surface of an interior frame member disposed within housing 104.

Referring back to FIG. 11A, a peripheral portion 1114 of first tail 1102*a* surrounding LED 1104 can be used as a surface for adhesively coupling the first tail 1102*a* to a mounting surface of a structure that surrounds LED 1104. The surface area of peripheral portion 1114 can depend on the size of LED 1104 and on the size of gap 1110. As described in more detail below, the surface area of peripheral portion 1114 can have an inverse relationship with gap 1110. In some embodiments, the surface area of peripheral portion 1114 can be very minute, causing alignment between peripheral portion 1114 and the mounting surface to be difficult due to a lack of surface area. Furthermore, in certain embodiments, peripheral portion 1114 does not have a sufficient surface area to maintain a robust adhesive coupling between the mounting surface and first tail 1102*a*.

Coupling a small peripheral portion 1114 with the mounting surface can be difficult and cumbersome, particularly when the coupling process is performed by hand. In some embodiments, the mounting surface can be positioned with respect to opening 1116 such that when peripheral portion 1114 is properly aligned and coupled to the mounting surface, the LED 1104 is also properly aligned with opening 1116. Consequently, any misalignment between peripheral portion 1114 and the mounting surface can result in LED 1104 being misaligned with opening 1116. A misalignment between LED 1104 and opening 1116 can result in an obstruction of light emitted from LED 1104 that is intended to pass through opening 1116. In some embodiments, a larger peripheral portion 1114 can be realized by cutting flexible circuit 1102 such that gap 1110 is reduced. By reducing gap 1110, less surface area of flexible circuit 1102 is cut away, providing more surface area to first tail 1102a that surrounds LED 1104 (i.e., a larger peripheral portion 1114).

FIG. 12A shows an exemplary embodiment of flexible circuit 1102 that has undergone a die cutting operation. As a result of the die cutting operation, flexible circuit 1102 includes a gap 1110a having a length w1. Gap 1110a can define in part a first tail 1102a and a second tail 1102b of flexible circuit 1102. The die cutting operation can include mechanically cutting flexible circuit 1102 with a cutting tool. In some embodiments, the die cutting operation can include using a die as a cutting guide when cutting flexible circuit 1102 with a cutting tool such as a blade. In other embodiments, a die having a cutting surface can be used as a cutting tool, similar to a cookie cutter. When performing a mechanical cut with a cutting tool, the width of the cut can be based on a width of a cutting surface of the cutting tool. For example, the width of the cut can be proportional to a width of a cutting surface of a blade used to make the cut. In this regard, length w1 can depend on the cutting tool that was used in the die cutting operation. In some cases, a die cutting operation can result in a length w1 of about 0.5 mm.

As a consequence of gap 1110a, LED 1104 is at a length, w2, from an edge of first tail 1102a as shown in FIG. 12A. Length w2 can have an inverse relationship with length w1. In this regard, as gap 1110a increases (i.e., increasing length w1) the smaller first tail 1102a (and/or second tail 1102b) becomes. Furthermore, as gap 1110a decreases, the larger first tail 1102a (and/or second tail 1102b) becomes. In some cases, the die cutting operation can result in a gap so big that it results in first tail 1102a having an insufficient amount of surface area for adhering first tail 1102a to a mounting surface.

FIG. 12B shows an exemplary embodiment of flexible circuit 1102 that has undergone a laser cutting operation. A laser cutting operation can include directing a high-powered laser at the material to be cut. The laser cutting operation can include any type of laser cutting including, but not limited to, vaporization cutting, fusion cutting, $CO_2$ based laser cutting, neodymium based laser cutting and/or neodymium yttrium-aluminum-garnet based laser cutting. The laser used in a laser cutting operation can be focused on a very small spot on the material. For example, a laser can be focused on a spot having a diameter of about 0.025 mm. Consequently, a laser cutting operation can provide a smaller cut relative to a cut provided by a die cutting operation. Still referring to FIG. 12B, flexible circuit 1102 includes a gap 1110b having a length w3. Length w3 can be substantially less than length w1. In some cases, length w3 can be on the order of ten times less than length w1. Hence, a length of gap 1110b can be substantially smaller than a length of gap 1110a.

As a consequence of gap 1110b, LED 1104 is at a length w4, from an edge of first tail 1102a as shown in FIG. 12B. First tail 1102a in FIG. 12B is larger relative to first tail 1102a in FIG. 12A. As discussed above, a smaller gap can result in a bigger first tail 1102a. In this regard, a length of first tail 1102a has increased (relative to a corresponding length of first tail 1102a in FIG. 12A) with respect to length w4; consequently length w4 is greater than length w2. The laser cutting operation provides a means for cutting flexible circuit 1102 with a smaller cut resulting in first tail 1102a having an increased surface area that surrounds LED 1104. The increased surface area can provide a greater tolerance in alignment and improve an adhesive coupling between first tail 1102a and a mounting structure as described in FIGS. 11A-11B.

Figure 13:
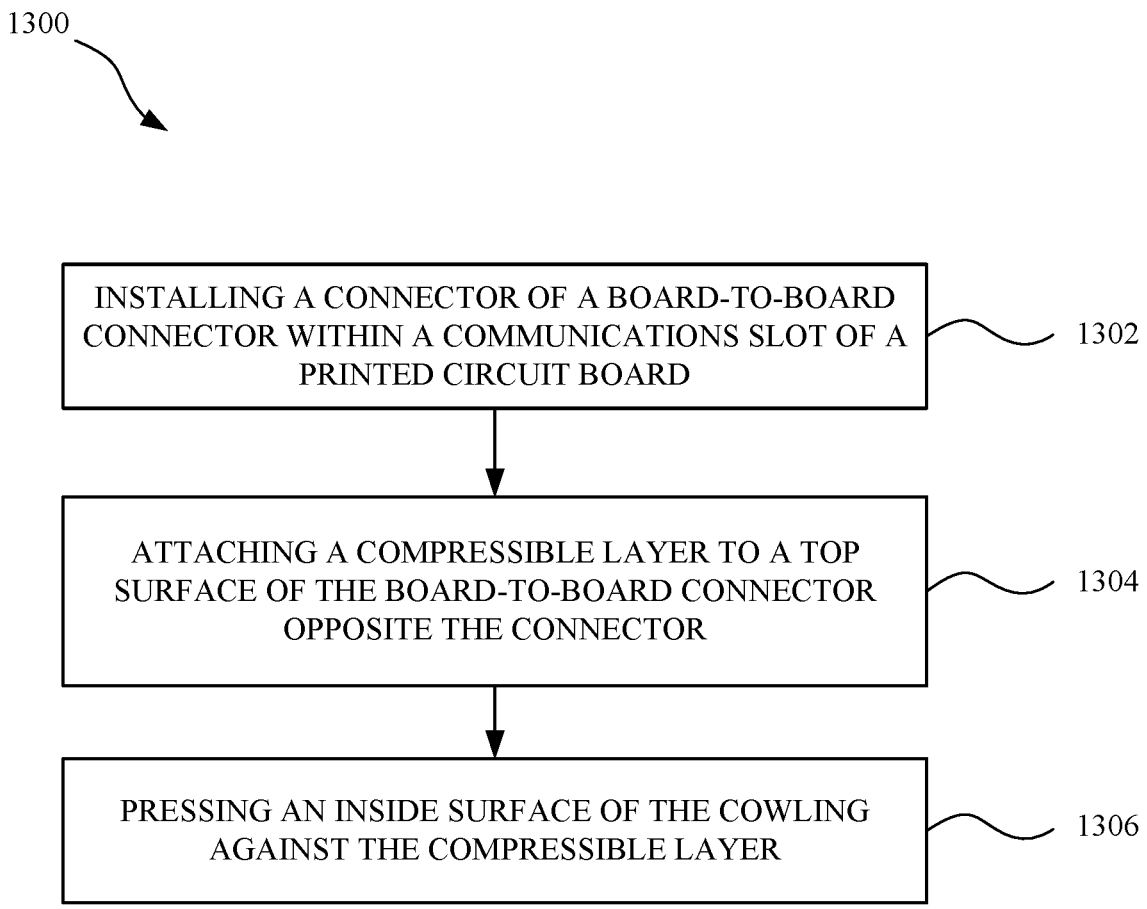
FIG. 13 shows a block diagram representing a method for securing a number of board-to-board connectors to a circuit board.

FIG. 13 shows a block diagram representing a method for securing a number of board-to-board connectors with a cowling. In a first step 1302 at least one connector of a board-to-board connector is coupled with a communication slot disposed on a PCB. At step 1304 a compressible layer is applied along a top surface of the board-to-board connector opposite the connector. In some embodiments, the compressible layer can be adhered to the top surface of the board-to-board connector prior to the connector being coupled with the communication slot. In some embodiments, the compressible layer can be a conductive foam pad. At step 1306 an inside surface of a metal cowling is compressed against the compressible layer. This compression can be accomplished by fastening the cowling to the PCB. In this way, the connector can be preloaded by the force transmitted through the compressible layer.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A switch assembly carried within a housing of a portable electronic device, the switch assembly comprising:
    a slide switch comprising a button that protrudes from an opening located at a side wall of the housing, the opening having a shape including a first dimension and a second dimension that is less than the first dimension, wherein the button is movable in a direction in accordance with the second dimension; and
    rails located at an inner surface of the side wall of the housing, wherein the rails limit movement of the slide switch in accordance with the second dimension.

2. The switch assembly of claim 1, wherein an amount of separation between a first rail and a second rail of the rails corresponds to the first dimension of the shape of the opening.

3. The switch assembly of claim 2, wherein the amount of separation between the first and second rails is maintained when the slide switch is moved in the direction according to the second dimension.

4. The switch assembly of claim 2, wherein each rail of the first and second rails includes a planar sliding surface that corresponds to a peripheral surface of the slide switch.

5. The switch assembly of claim 1, wherein the first dimension corresponds to a length of the shape of the opening and the second dimension corresponds to a width of the shape of the opening.

6. The switch assembly of claim 1, wherein the rails are coupled to an internal frame member that is disposed within the housing.

7. The switch assembly of claim 6, wherein the rails are coupled to the internal frame member via a weld, an adhesive, or a brazing material.

8. The switch assembly of claim 1, wherein the slide switch further comprises a protrusion that faces away from the opening and is configured to engage an electrical switch that is carried within the housing.

9. The switch assembly of claim 1, wherein the rails are integrally formed with an internal frame member that is disposed within the housing.

10. A housing of a portable electronic device that carries a switch mechanism, the housing comprising:
    walls of the housing that define an interior cavity, wherein a wall includes an opening that extends between the interior cavity and an external surface of the wall, the opening having a shape comprising a first dimension and a second dimension that is different from the first dimension;
    an internal frame that is coupled to an internal surface of the housing, wherein the internal frame includes an aperture that has a shape and size that corresponds to the shape of the opening;
    a switch including a first surface that is exposed by the opening, wherein the switch is configured to be toggled between a first position and a second position; and
    rails coupled to the internal frame and limit movement of the switch to a direction corresponding to the second dimension when the switch is toggled between the first and second positions.

11. The housing of the portable electronic device of claim 10, wherein the switch further comprises a second surface that includes a protrusion that is coupled to an electronic component carried within the housing, and the second surface is opposite the first surface.

12. The housing of the portable electronic device of claim 10, wherein the internal frame is coupled to the internal surface of the housing via at least one of an adhesive, a friction fit member, a fastening member, or a molded material.

13. The housing of the portable electronic device of claim 10, wherein the rails are welded to the internal frame.

14. The housing of the portable electronic device of claim 10, wherein the rails are separately formed from the internal frame.

15. The housing of the portable electronic device of claim 10, wherein each rail of the rails includes a planar sliding surface that corresponds to a planar edge of the switch.

16. The housing of the portable electronic device of claim 10, wherein the first dimension corresponds to a length of the shape of the opening and the second dimension corresponds to a width of the shape of the opening.

17. The housing of the portable electronic device of claim 16, wherein the first dimension is greater than the second dimension.

* * * * *